(12) United States Patent
Chaji

(10) Patent No.: US 11,854,783 B2
(45) Date of Patent: Dec. 26, 2023

(54) MICRO DEVICE ARRANGEMENT IN DONOR SUBSTRATE

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 197 days.

(21) Appl. No.: 17/521,393

(22) Filed: Nov. 8, 2021

(65) Prior Publication Data

US 2022/0059389 A1 Feb. 24, 2022

Related U.S. Application Data

(62) Division of application No. 16/684,820, filed on Nov. 15, 2019, now Pat. No. 11,195,741, which is a
(Continued)

(30) Foreign Application Priority Data

Sep. 6, 2016 (CA) .................................. CA 2941038

(51) Int. Cl.
*H01L 21/683* (2006.01)
*H01L 23/00* (2006.01)
(Continued)

(52) U.S. Cl.
CPC ...... *H01L 21/6835* (2013.01); *G01R 31/2607* (2013.01); *H01L 22/12* (2013.01); *H01L 22/20* (2013.01); *H01L 24/32* (2013.01); *H01L 24/33* (2013.01); *H01L 24/83* (2013.01); *H01L 24/95* (2013.01); *H05K 1/111* (2013.01); *H01L 21/68* (2013.01); *H01L 24/06* (2013.01); *H01L 25/0753* (2013.01); *H01L 2221/68309* (2013.01); *H01L 2221/68363* (2013.01); *H01L 2224/32113* (2013.01); *H01L 2224/32221* (2013.01); *H01L 2224/3303* (2013.01); *H01L 2224/83005* (2013.01); *H01L 2224/8316* (2013.01); *H01L 2224/8318* (2013.01); *H01L 2224/83123* (2013.01);
(Continued)

(58) Field of Classification Search
CPC ...... H01L 21/6835; H01L 22/12; H01L 22/20
See application file for complete search history.

(56) References Cited

U.S. PATENT DOCUMENTS 6,132,909 A  10/2000 Phillips
8,349,116 B1  1/2013 Bibl
(Continued)

FOREIGN PATENT DOCUMENTS

WO   WO 1997/036194   10/1991
WO   WO 2002/022374   3/2002
WO   WO 2016/100662   6/2016

OTHER PUBLICATIONS

International Search Report and Written Opinion in International Application No. PCT/IB2017/056082, dated Jan. 30, 2018 (7 pages).

*Primary Examiner* — Marvin Payen
(74) *Attorney, Agent, or Firm* — Nixon Peabody LLP

(57) ABSTRACT

This disclosure is related to arranging micro devices in the donor substrate by either patterning or population so that there is no interfering with unwanted pads and the non-interfering area in the donor substrate is maximized. This enables to transfer the devices to receiver substrate with fewer steps.

2 Claims, 27 Drawing Sheets

Related U.S. Application Data division of application No. 15/696,700, filed on Sep. 6, 2017, now Pat. No. 10,535,546.

(60) Provisional application No. 62/403,741, filed on Oct. 4, 2016.

(51) Int. Cl.
*H01L 21/66* (2006.01)
*G01R 31/26* (2020.01)
*H05K 1/11* (2006.01)
*H01L 25/075* (2006.01)
*H01L 21/68* (2006.01)
*H10K 59/12* (2023.01)

(52) U.S. Cl.
CPC ............ *H01L 2224/83192* (2013.01); *H01L 2224/83194* (2013.01); *H01L 2224/83986* (2013.01); *H01L 2224/95136* (2013.01); *H10K 59/12* (2023.02)

(56) References Cited

U.S. PATENT DOCUMENTS

2011/0151153 A1   6/2011  Felder
2017/0373046 A1  12/2017  Gardner

MICRO DEVICE ARRANGEMENT IN DONOR SUBSTRATE

CROSS-REFERENCE TO RELATED APPLICATIONS

The present application is a division of U.S. patent application Ser. No. 16/684,820, filed on Nov. 15, 2019, now allowed, which is a division of U.S. patent application Ser. No. 15/696,700, filed on Sep. 6, 2017, now U.S. Pat. No. 10,535,546, issued on Jan 14, 2020, which claims the benefit of and priority to U.S. Provisional Patent Application No. 62/403,741, filed on Oct. 4, 2016, and Canadian Patent Application No. 2,941,038, filed on Sep. 6, 2016, each of which is hereby incorporated by reference herein in its entirety.

FIELD OF THE INVENTION

The present disclosure relates to the integration of a transferred micro device system on a receiver substrate. More specifically, the present disclosure relates to patterning micro devices on a donor substrate and the landing area on a receiver substrate to increase the efficiency of the transfer process.

SUMMARY

A few embodiments of this description relate to patterning micro devices on the donor substrate to facilitate a selective transfer process. The micro device array may comprise micro light emitting diodes (LEDs), organic LEDs, sensors, solid state devices, integrated circuits, MEMS (microelectromechanical systems), and/or other electronic components. Other embodiments are related to patterning the placing of micro devices in respect to pixel arrays to optimize microdevice utilizations in the selective transfer process. The receiving substrate may be, but is not no limited to, a printed circuit board (PCB), thin film transistor backplane, integrated circuit substrate, or, in one case of optical micro devices such as LEDs, a component of a display, for example a driving circuitry backplane. Patterning a micro device donor substrate and receiver substrate can be combined—with different transfer technology including but not limited to pick and place with different mechanisms (e.g., electrostatic transfer head, elastomer transfer head), or a direct transfer mechanism such as dual function pads and more.

In one embodiment, the microdevices on donor substrates are patterned in clusters. The clusters may have a smaller pitch than the pixels on the receiver substrate and the pitch on the receiver substrate may not be a multiple of the pitch of micro devices on the donor substrate. The cluster can be the size of the pixel pitch of the receiver substrate. The area between each cluster is different from the micro device if the pitch of the pixel is not a multiple of the micro device pitch in the donor substrate.

In another embodiment, the receiver substrate needs to be populated with different types of micro devices and each pixel has different subpixels for different types of micro devices. To avoid transferring the wrong type of micro devices to the subpixels, the donor substrate is divided into two areas in which, 1) if there are micro devices without interfering areas with other micro device pads on the system substrate during the transfer process, and 2) the areas that will interfere with other micro device pads on the system substrate if there is a micro device in those areas.

In one embodiment the micro devices in the donor substrate only exist in the areas without interference.

In one embodiment, the direction that the donor substrate is moved (or the direction that the system substrate is moved) in reference to the system substrate (or in reference to the donor substrate) is used to define the non-interfering areas and interfering areas.

In another embodiment, the subpixel pads for different micro devices are put close together, where the pad distance between at least two pads is smaller than the pitch of the pixel divided by the number of subpixels. In one case, the pitch between the pads of a subpixel in one pixel (or adjacent pixels) matches the donor substrate pitch (or is a multiple of the donor substrate pitch). It is possible that different donor substrates with different micro devices have different pitch. It is possible that the pads for different micro devices have different sizes. The pad cluster for subpixel can be in different areas of a pixel in reference to the pixel area.

In one embodiment, the pad arrangement for different micro devices is aligned either vertically or horizontally.

In another embodiment the pads are aligned in both dimensions.

According to one aspect there is provided a method for integrated device fabrication, where the integrated device comprises a plurality of pixels each comprising at least one subpixel comprising a micro device integrated on a substrate, and the method comprises: defining areas in the donor substrate with and without interference areas with other micro devices pads, and minimizing the areas with interference to improve micro device utilization.

BRIEF DESCRIPTION OF THE DRAWINGS

The foregoing and other advantages of the disclosure will become apparent upon reading the following detailed description and upon reference to the drawings.

Figure 1:
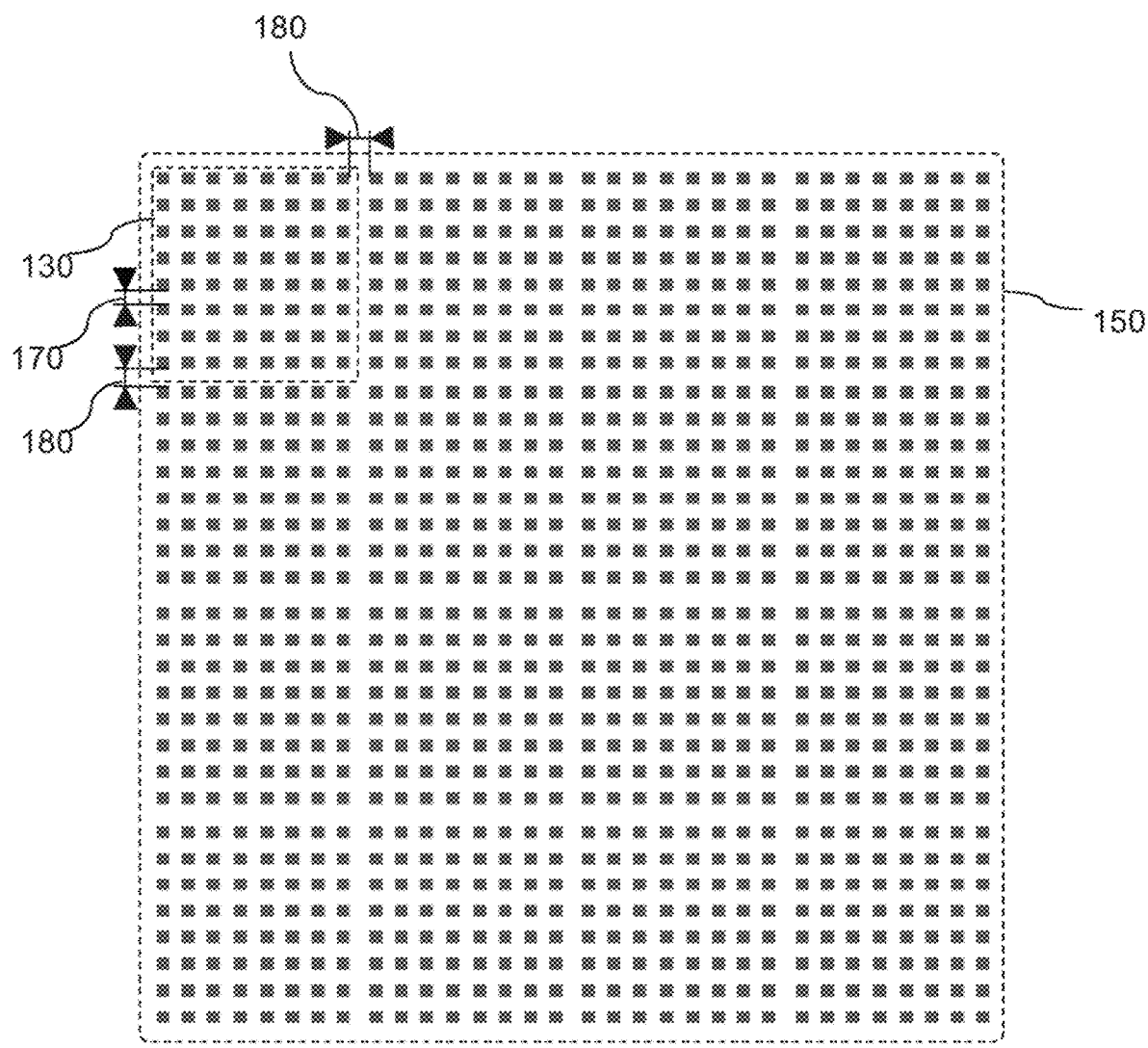
FIG. 1 shows an example of a micro device arrangement in a donor substrate.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

The process of transferring micro devices into a receiver substrate consists of pre-processing the devices on a donor substrate (or a temporary substrate), preparing the landing area (or pads) on a receiver substrate, transferring the micro devices from the donor to the receiver substrate, and post processing to enable device functionality. The pre-processing step may include patterning and adding bonding elements. The transfer process may involve bonding a pre-selected array of micro devices to the receiver substrate followed by removing the donor substrate. Several different selective transfer processes have already been developed for micro devices.

In this disclosure, pads in a receiver substrate refers to a designated area on a receiver substrate where a micro device is transferred. The pads could be conducive to prepare a connection between the micro device and the pixel circuits or connections where the pixel circuits can be underneath the pad or on the side of the pad. The pad could have some form of bonding materials to hold the micro device permanently. The pad can be a stack of multi-layers to offer a more mechanically stable structure and also better functionality such as bonding and conductivity capability.

The pads in this description can provide an electrical connection, a mechanical connection or just a defined area to transfer micro devices. The shape of pads used in the embodiments are for illustration purposes and can have any arbitrary shape. The position of pads in respect to the pixels can be changed without affecting the embodiments. The orientation of the group of pads in the pixel can be changed. For example, they can be rotated, shifted, or moved to different positions. The pads can have a complex structure consisting of different conductive, semiconductor, and dielectric layers. The pads can be positioned on top of other structures such as transistors in the receiver substrate. Also, the pads can be beside other structures on the receiver substrates.

The shape of micro devices used in the embodiments are for illustration purposes and devices can have different shapes. The micro devices can have one or more pads on a side that will contact the receiver substrate. The pads can be mechanical, electrical, or a combination of both.

In one embodiment, a method to arrange micro devices in the donor substrate is described that is used to transfer micro devices to the receiver substrate. In the donor substrate, micro devices are arranged in relation to the pixel area, and within the area associated with the pixel, the micro devices have a pitch that is smaller than the pixel pitch.

In this arrangement, the pitch between the micro devices at the boundary of two pixels can be different from the pitch of micro devices within the pixel.

In this case, there are more micro devices in the donor substrate than intended/wanted pads in the receiver substrate associated with the donor substrate. Therefore, the micro devices can interfere with other unwanted/unintended pads in the receiver substrate. Several embodiments in this document define interfering areas in the donor substrate to remove or prevent micro devices from populating those areas. These embodiments can be used for different micro device arrangements in the donor substrate.

In another embodiment, a method of arranging the micro devices described in the donor substrate to avoid interference with unwanted pads is provided where the method includes:
 a) defining non-interfering areas where:
  1) the non-interfering areas are spaces in the donor substrate that are not covered by other unwanted pads during micro device transfer to the receiver substrate or
  2) will not be covered by pads after offsetting the donor or receiver substrate in a certain direction to align at least one micro device with a wanted pad in the receiver substrate after at least one micro device different from said micro device is transferred to a pad that is different from the said pad in the receiver substrate.
 b) arranging micro devices in the non-interfering areas of the donor substrate.

In the receiver substrate described above, one pad on the receiver can have a taller structure and the micro device associated with said pad have a shorter structure. Thus, there will be no interfering area for this pad.

To increase the non-interfering area, one embodiment is a method to arrange the pads associated with the micro device transfer position in the receiver substrate to clusters, where, within said clusters, the pad pitch is smaller than the subpixel pitch.

For cluster pads, a donor substrate for a pad at the edge of a cluster is arranged in such a way that interfering and non-interfering areas are similar to the pixel area, where the width of the interfering area is the same as the distance of the other pads from said pad.

For a cluster, a donor substrate for a pad inside of a cluster is arranged whose interfering and non-interfering areas are similar to the pixel area and the interfering areas are defined as:

Finding the distance between the pad and the edge of said cluster pad.

Picking one micro device as a reference device in the donor substrate.

Defining the interfering area from the micro device to both sides similar to the distance of the associated pads to the edge of the cluster.

The pattern of interfering and non-interfering areas defined for an area associated with a pixel in a donor substrate can be repeated in a donor substrate similar to the pixel pitch.

In the remaining area of the donor substrate that is patterned (arranged) for the middle pad and associated with each pixel, a column (or row) of micro devices rests between interfering areas whose width is larger than the minimum distance of the middle micro device from the edge of said cluster.

In one embodiment to maximize the non-interfering area, the pad pitch within the cluster is the same as the micro device pitch in the donor substrate.

In another embodiment to maximize the non-interfering area, the pads are arranged in a two-dimensional cluster. The pads in the cluster can be aligned with at least one other pad.

In one embodiment, a donor substrate for the pads aligned with other pads in two directions has diagonal interfering areas in reference to the pad cluster orientations and the said area contains other pads and the remaining area associated with a pixel is non-interfering in which micro devices can exist.

In another embodiment, a donor substrate for the pads is aligned with the pads in only one direction and has interfering area as:
    a) One row including other pads if the said pad is aligned vertically with the other pads or;
    b) One column if the said pad is aligned horizontally with another pad.
And the remaining area associated with a pixel is non-interfering in which micro devices can exist.

FIG. 1 shows a donor substrate arrangement 150 with more micro devices than associated pads in the receiver substrate. In this case, the micro devices have a smaller pitch 170 than the pixel pitch of the receiver substrate in an area or block 130 of the donor substrate associated with the pixels. Also, as the pixel pitch may not be a multiple of the micro device pitch 170, the micro device pitch 180 between two pixel areas may have a different pitch to accommodate the difference between the pixel and micro device pitches.

In traditional pick and place, the microdevices on the transfer head (donor substrate 150) are transferred one at a time or one row at a time to a position on the receiver substrate. To populate the rest of the receiver substrate or another receiver substrate, the transfer head needs to be repopulated or a new donor substrate 150 must be used. This process requires fast and accurate movement and precision alignment every time. This invention enables more microdevices 150 on the donor substrate than what is required to populate the receiver substrate equivalent area. Then, the donor substrate (or receiver substrate) is offset to align the remaining set of micro devices with corresponding locations in the receiver substrate. The offset can be done independently or it can be part of moving the donor substrate 150 to the new location on the receiver substrate or a new receiver substrate. However, if the receiver substrate requires different micro devices that are part of different donor substrates, the extra devices on a donor substrate can interfere with the location (pads) assigned to other types of micro devices on the receiver substrate. This invention offers different patterning for devices on the donor substrate to avoid such issues.

Figure 2:
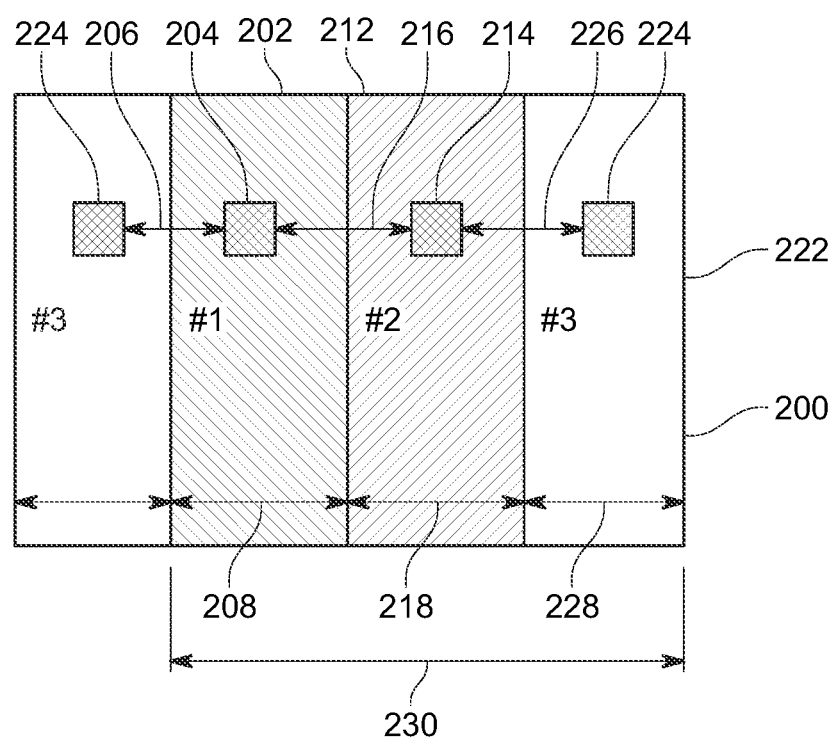
FIG. 2 shows an example of a receiver substrate pixel with three different sub pixels.

FIG. 2 shows a pixel structure in a receiver substrate. The array can be made of a different orientation and combination of this pixel structure. The pixel structure consists of different micro devices and each micro device can have different pixel circuit or pixel connections. The pads 204, 214, 224 for each microdevice type are put in each designated subpixel area 202, 212, 222. Here, the substrate shows three pads 204, 214, 224 for three different micro devices. However, one can use different micro devices. In one array structure, the micro device types (or subpixel type) only vary in one direction (one-directional array structure). In another array type, micro devices can vary in two or more directions (multi-directional array). If the donor substrate for each device type has micro devices in all the areas, micro devices in areas corresponding to the pads of the other micro device types can interfere with the pads during the transfer process. In one case, the only micro devices on the area related to its pads on the receiver substrate remain on the donor substrate. However, in this case the donor substrate needs to be replaced or refilled after each transfer which can reduce the processing step. Moreover, it can affect the micro device utilization if the reset of micro devices cannot be used. In one aspect of the invention, the donor substrate for each micro device is divided into interfering and non-interfering areas. The micro devices from the interfering areas are removed or not populated. In one aspect of this invention, the micro devices are arranged in a donor substrate to avoid interference with unwanted pads where the method includes:
    a) defining non-interfering areas where:
        3) the non-interfering areas are spaces in the donor substrate that are not covered by other unwanted pads during micro device transfer to the receiver substrate or
        4) will not be covered by pads after offsetting the donor or receiver substrate in a certain direction to align at least one micro device with a wanted pad in the receiver substrate after at least one micro device different from said micro device is transferred to a pad that is different from the said pad in the receiver substrate.
    b) arranging micro devices in the non-interfering areas of the donor substrate.

In one way to define these areas, the directions to offset a donor substrate (or receiver substrate) in relation to a receiver substrate (or donor substrate) are defined. For example, after a first set of micro devices are transferred from the donor substrate into the receiver substrate, the donor substrate is offset horizontally and vertically. The other set of micro devices can be aligned with other related pads and transferred to these pads in a receiver substrate that can be the original receiver substrate or a different one. The following procedure is an exemplary process that can be used to identify the interfering and non-interfering area:

a) The first set of micro devices to transfer to the receiver substrate is used as reference.
b) From the reference, micro devices draw lines in parallel with the offsetting direction.
c) A line is drawn in the direction of offsets from the corresponding pads for other types of micro devices in reference to the reference pads on the donor substrate.
d) The closest lines from other types to the lines of the micro device on the donor substrate are identified.
e) Draw a line between the selected lines and the micro device line. This line has a similar distance from each of the micro device lines and selected lines.
f) The areas defined by the new lines and encompassing the micro device are the non-interfering areas. The other areas are defined as interfering areas.

Figure 3A:
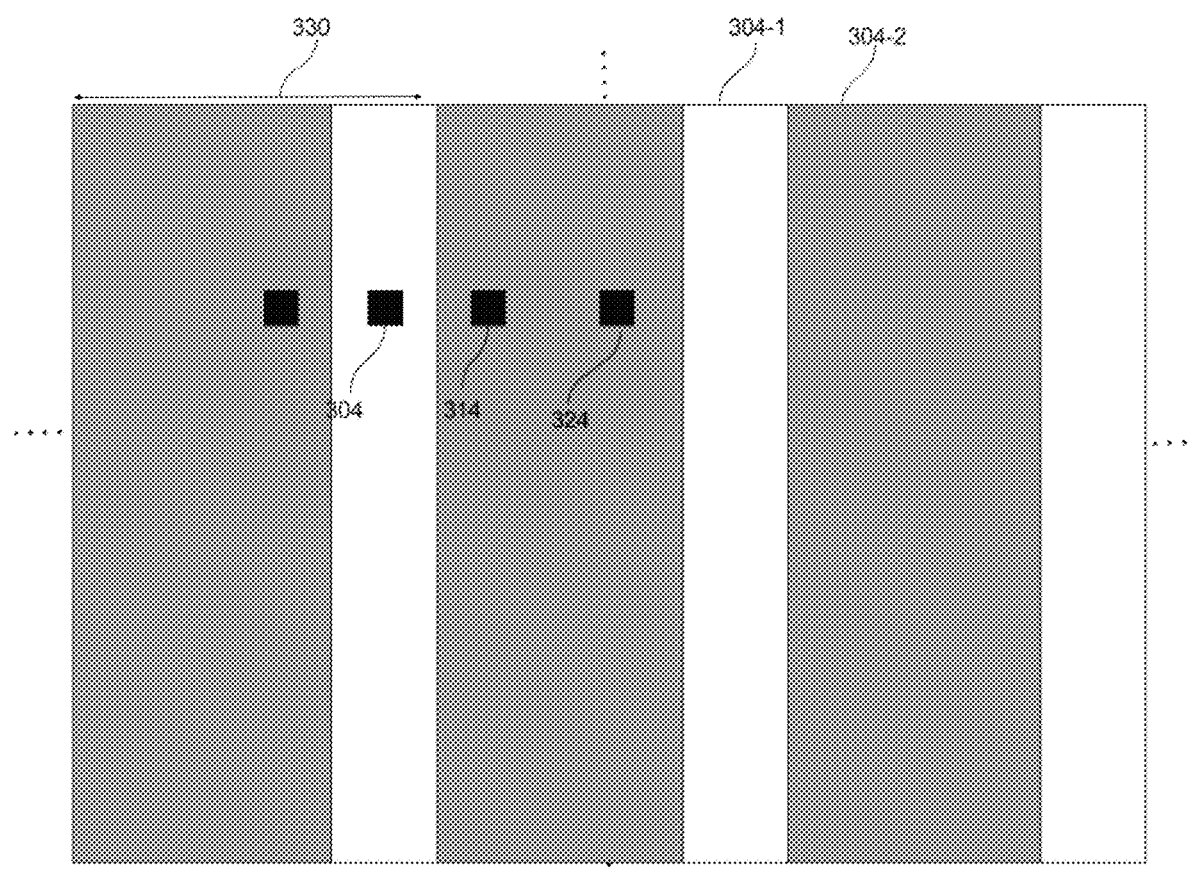
FIG. 3A shows an embodiment of a donor substrate that is arranged for interference and non-interference areas based on the receiver substrate.
Figure 3B:
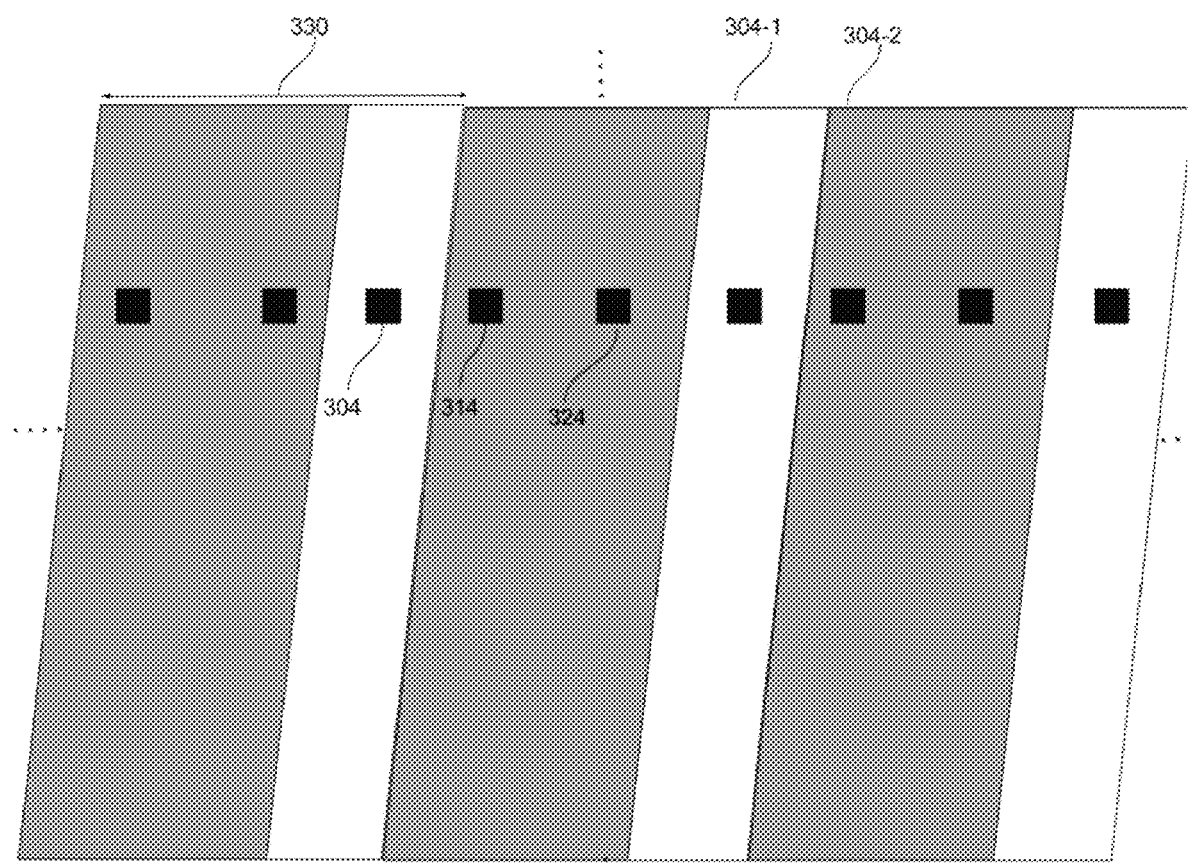
FIG. 3B shows another embodiment of donor substrate that is arranged for interference and non-interference areas based on the receiver substrate.

FIG. 3A shows one example of defining non-interfering area 304-1 and interfering area 304-2. The pixel area 330 includes both areas. In this case, the micro devices are offset horizontally and vertically. As a result, the width of the non-interfering area for each micro device is the half of the sum of the distances between that pad 304 for that micro device and the other adjacent pads 314, 324. In FIG. 3B, the devices are offset horizontally and diagonally. As a result, the non-interfering area has a slope similar to the slope of the diagonal offset process. As can be seen in both cases, the non-interfering area 304-1 is small compared to the interfering area 304-2.

Figure 4:
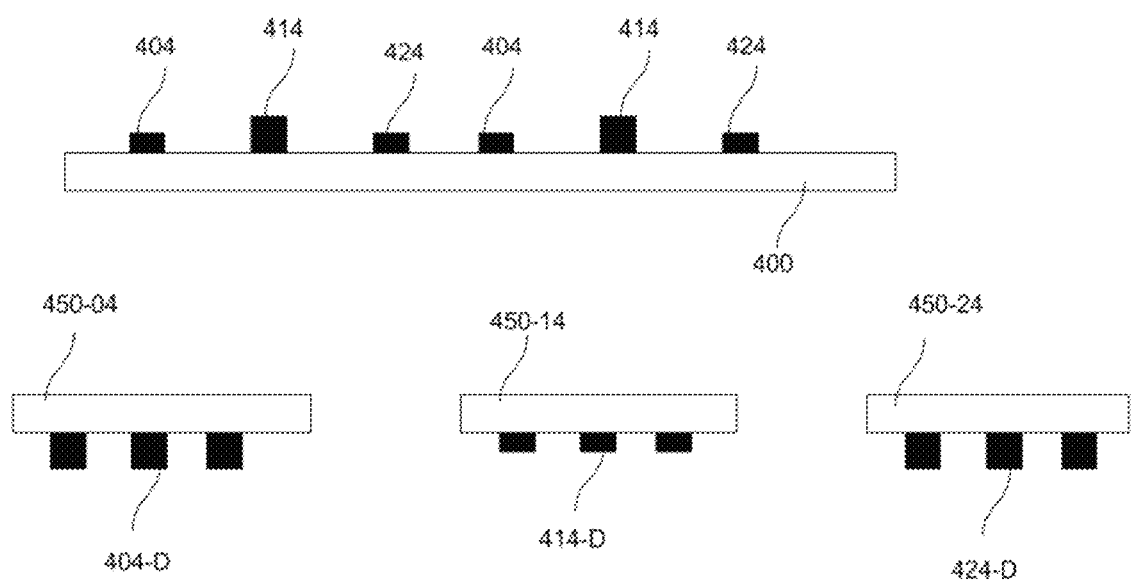
FIG. 4 shows an embodiment using a taller pad associated with one of the microdevices to improve the non-interfering area.

One solution to address this issue is making one of the pads taller. This device can be the more expensive device or more used in the receiver substrate. However, it can be any other device as well. In this case, the other micro devices should have a taller structure compared to the micro devices associated with the taller pad. One method to achieve a taller device is to have taller connection pads. The taller pad can be at either side of the device. FIG. 4 shows an exemplary receiver substrate 400 where one of its pads 414 is taller than the other two pads 404, 424. Here, three different micro devices 404-D, 414-D, 424-D are being transferred to the receiver substrate 400 from donor substrates 450-04, 450-14, 450-24. The micro devices 404-D, 424-D associated with the shorter pad structures 404, 424, have taller structures compared to the other micro device 414-D. The same technique can be applied to other combinations of micro devices (more or fewer than three micro devices).

Figure 5:
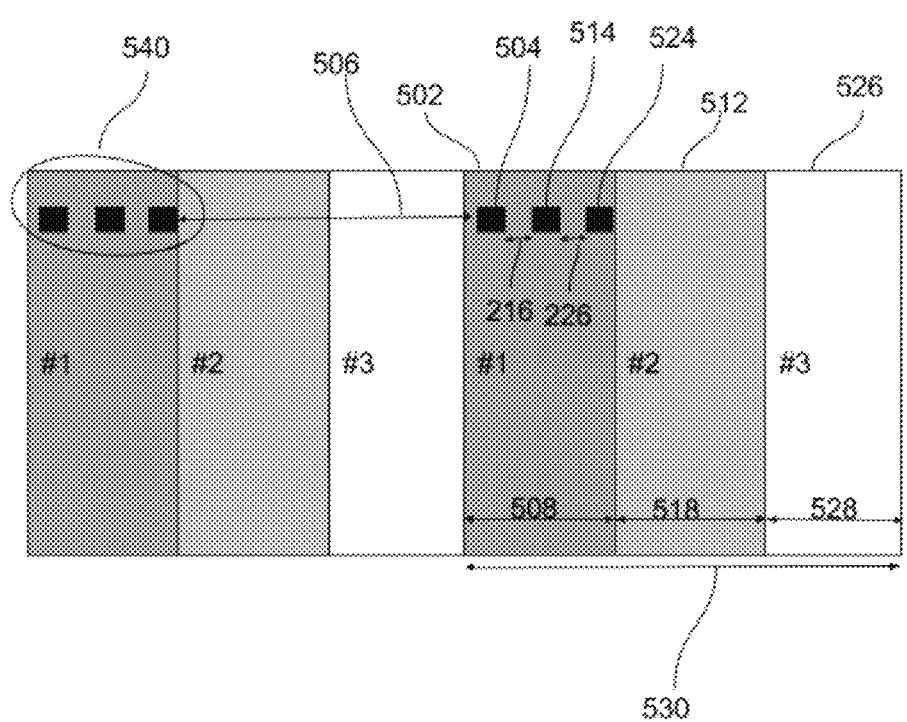
FIG. 5 shows a cluster pad embodiment to improve the non-interfering area.

In another solution shown in FIG. 5, the pads 504, 514, and 524 for different micro devices are set in a cluster 540 close to each other. In one embodiment, the circuit or other connections associated with the pads can be defined in the subpixel structures #1, #2, and #3 with widths 508, 518, and 528, respectively, for ease of implementation. In another embodiment, the circuits and connections can have any other structure. The closer the pads are together, the larger the non-interfering area 506 will be. In one case, the distance between two pads can be equal or smaller than ⅓ of the pixel pitch 530 for three different micro devices (three different subpixels). For more or fewer subpixels (micro device types) the pads are also put closer together. In one embodiment, the distance between the pads in the cluster is similar to the micro device pitch. If the different micro devices have the same pitch, the cluster pads will have the same pitch. In another case, the distance between the pads in the cluster is a multiple of (for example twice) the pitch of the micro devices. In another embodiment, the distance between the pads can be smaller than the pitch of the micro devices. FIG. 5 shows a receiver substrate with an example of pad clusters 540. These pads 504, 514, 524 can be from the sub-pixels 502, 512, 522 in one pixel 530 or from different pixels. These pads 504, 514, 524 can be in any position in reference to the pixel 530. It is possible that the order and position of the pads 504, 514, 524 are different for different pixels.

Figure 6A:
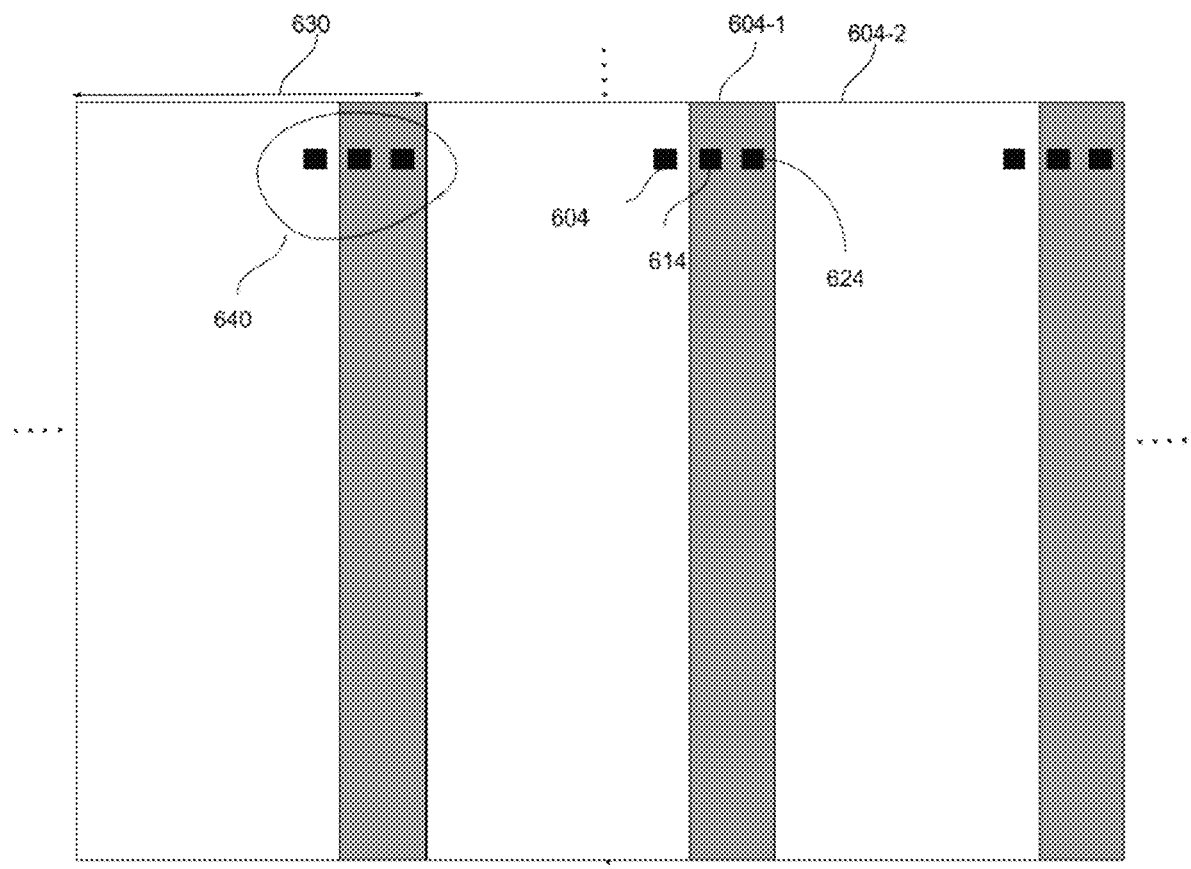
FIG. 6A shows a donor substrate embodiment with non-interfering areas associated with the pads at the edge of the cluster pads.
Figure 6B:
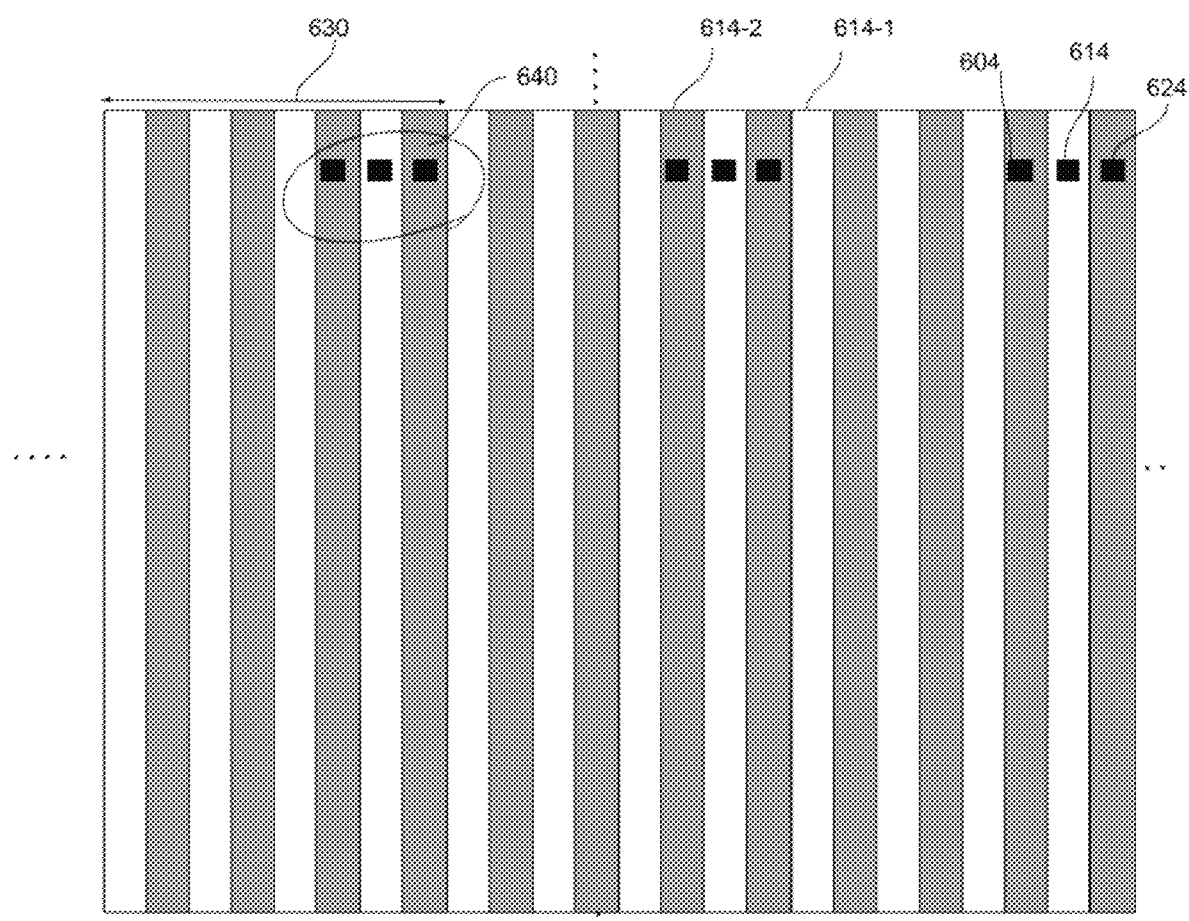
FIG. 6B shows a donor substrate embodiment with non-interfering areas associated with the inside pads of the cluster.

FIG. 6A shows the non-interfering area 604-1, and interfering area 604-2 for the pad 604 at the edge of the cluster 640. The same structure can be used for the other pad 624 at the other side of the cluster 640. As can be seen, the non-interfering areas for the pads at the edge are larger compared to previous cases. For the pad 614 in the middle, the non-interfering area 614-1 and interfering area 614-2 can be a stripe pattern as demonstrated in FIG. 6B. Here, the width of the strip is the same as the distance between the middle pad and the other pads. To define the non-interfering areas, the following steps can be used:

a) Find the distance between the pad and the edge of said cluster pad
b) Pick one micro device as a reference device in the donor substrate
c) Define the interfering area from the micro device to both sides similar to the distance of the associated pads to the edge of cluster.

The pattern of interfering and non-interfering areas defined for an area associated with a pixel in the donor substrate can be repeated in the donor substrate similar to the pixel pitch.

In the remaining area of the donor substrate that is patterned (arranged) for the middle pad and associated with each pixel, a column (or row) of micro devices rests between interfering areas whose width is larger than the minimum distance of the middle micro device from the edge of said cluster.

If the distance between the middle pad and the other pads is the same, the ratio of interfering area 614-1 to non-interfering area 614-2 can be the same. Similar to FIG. 3B, here the two areas can have different shapes depending on the offsetting direction. Also, similar to FIG. 4, the middle pad can be taller and so in this case the non-interfering area for the middle micro device can be the entire donor substrate.

If the micro devices do not have similar pitch, the distance between pads in the cluster can be similar to any of the pitches or each pad can have a different distance from the other pads. To improve the non-interfering area, the middle device can be the one with the larger pitch, and so using taller pads can help improve the interfering area.

Figure 7A:
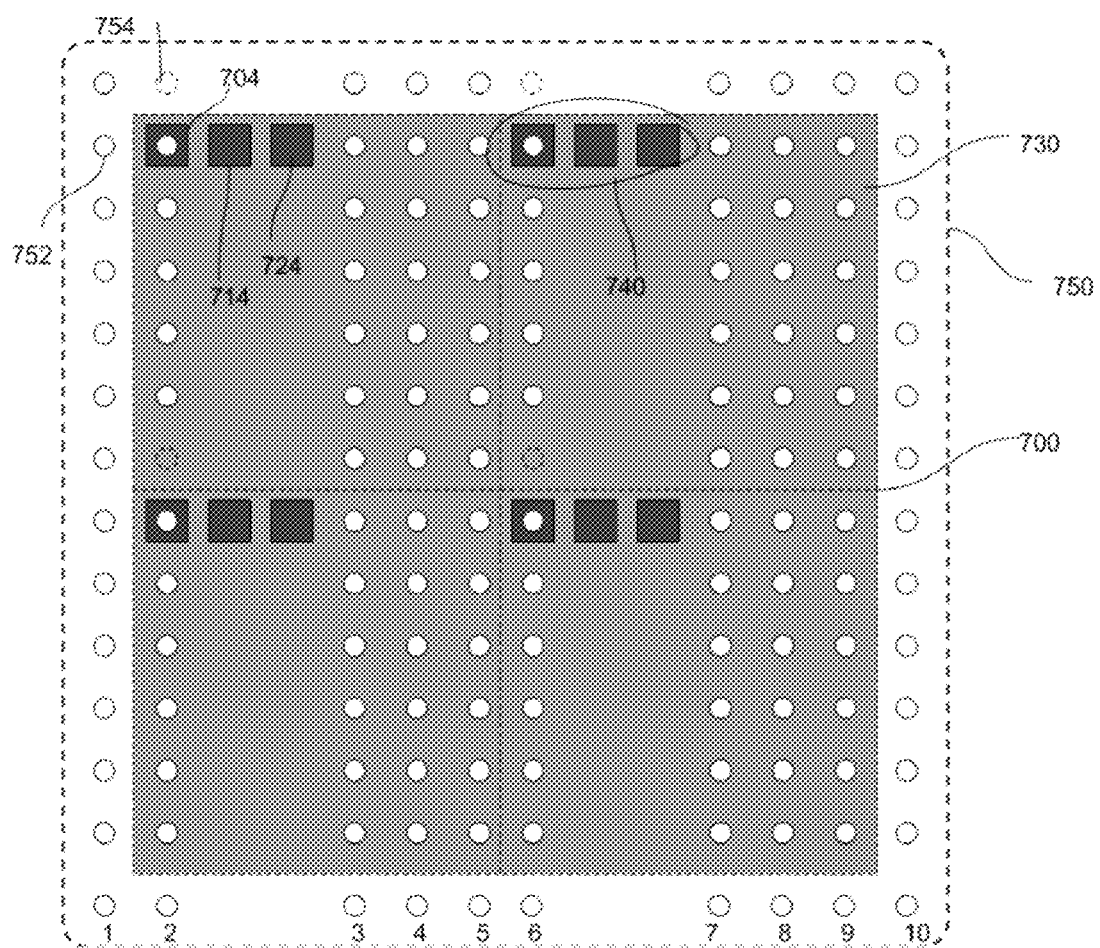
FIG. 7A shows an example of donor substrate and receiver substrate with cluster pads.
Figure 7B:
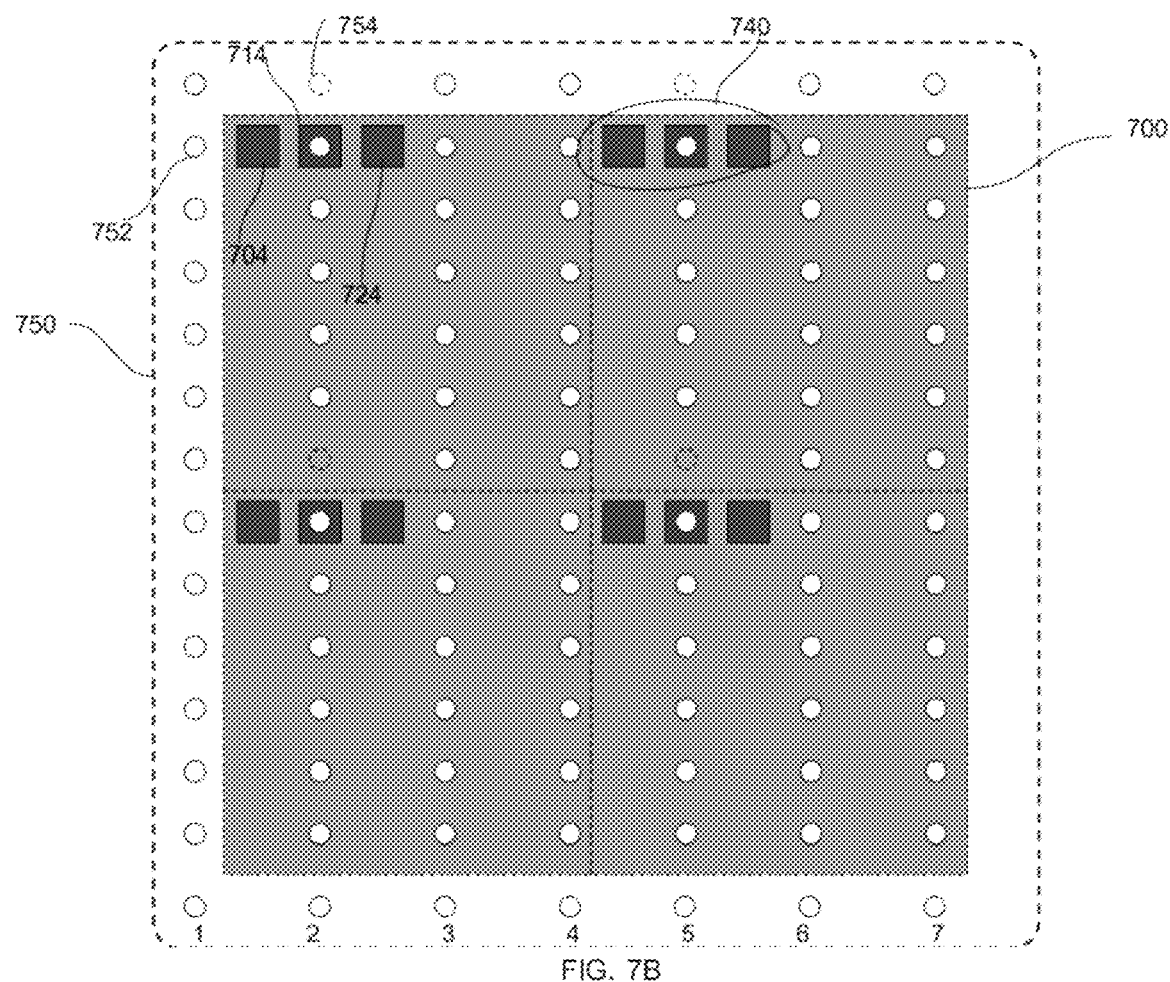
FIG. 7B shows another example of donor substrate and receiver substrate with cluster pads.

FIG. 7 shows a case where the pads 704, 714, 724 in receiver substrate 700 have the same pitch as micro devices in donor substrate 750. The position of pads cluster 740 can be different in reference to the pixels 730. The size of pads can be smaller than, similar to, or larger than micro devices. The shape of the micro devices and pads can be anything. In this case, the micro devices are removed (or not populated) from the interfering area on the donor substrate 750. FIG. 7A shows a case for the edge pad 704 (similar structure can be used for 724). Some of micro devices 754 are already transferred and the donor substrate 750 (or receiver substrate 700) is offsetted vertically in reference to receiver substrate 700 (or substrate 750) so that another device is aligned with the bare pads 704 (pads with no micro device transferred). It can be also done horizontally. In this case, the empty space created by transferring micro device 754 will be a new empty area which will be on top of 714 and the empty space that was on top of 714 will be on top of 724. As such there will be no interference caused by the micro devices for the unwanted pads 714, 724. One can finish all the micro devices in one column by offsetting vertically first and then moving to the next column (for example after finishing column 2, move to column 1). However other combinations of vertical and horizontal offsetting can be used. The pixels 730 or the pad clusters 740 can be at an angle either vertically or horizontally. In this case, the rows or the columns of micro devices will be tilted as well. In addition, the micro devices can be at an angle without pads or pixels being at angles. In this case, the offsetting direction will be toward the angle of the column or the row. FIG. 7B shows a similar structure of pad 704 in FIG. 7A for the middle pad 714.

Figure 8:
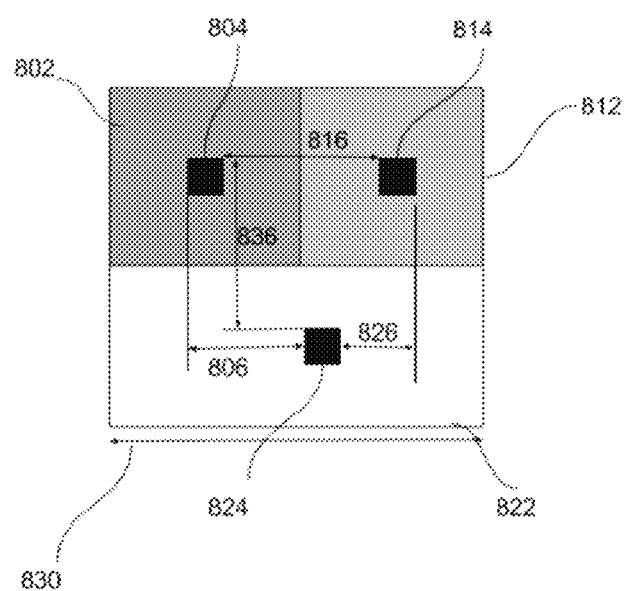
FIG. 8 shows an example of receiver substrates with pads in the pixel arranged in two directions.
Figure 9A:
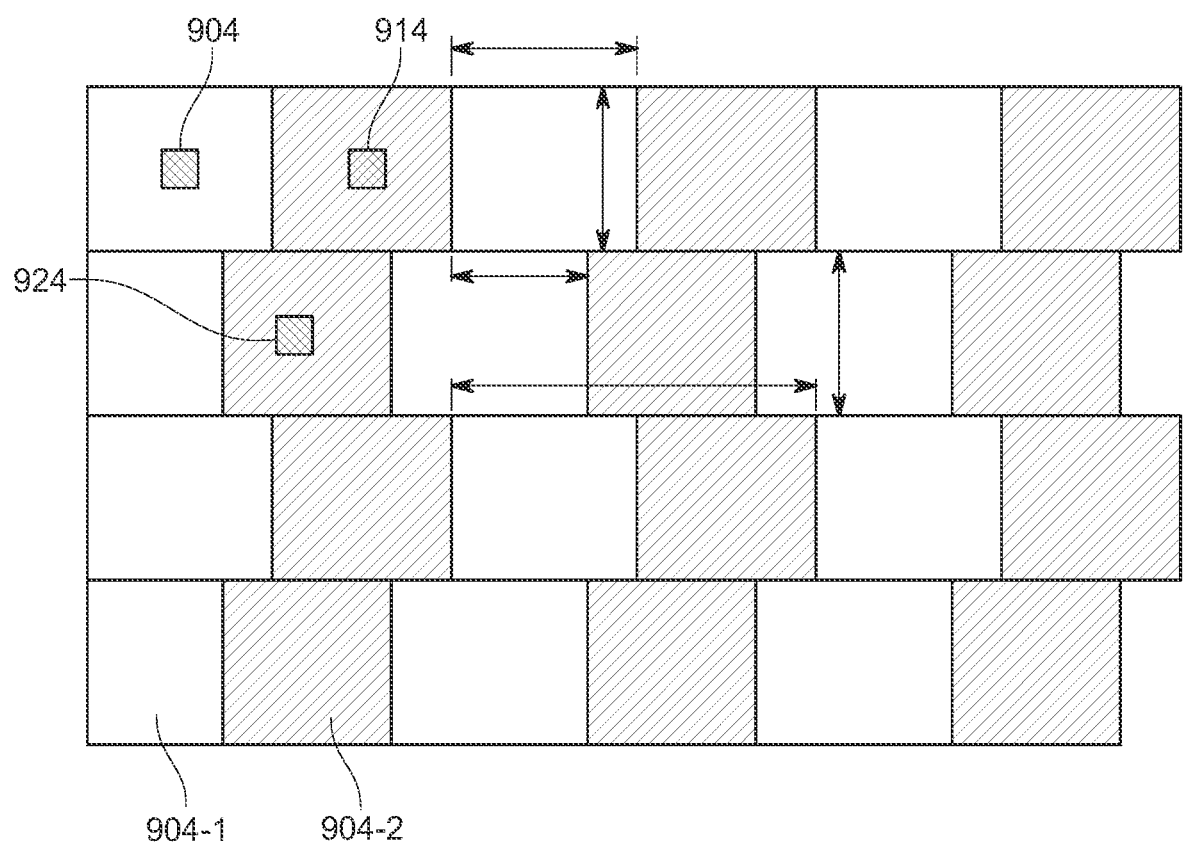
FIG. 9A shows a donor substrate embodiment with non-interfering area associated with the one of the pads in the pixel.
Figure 9B:
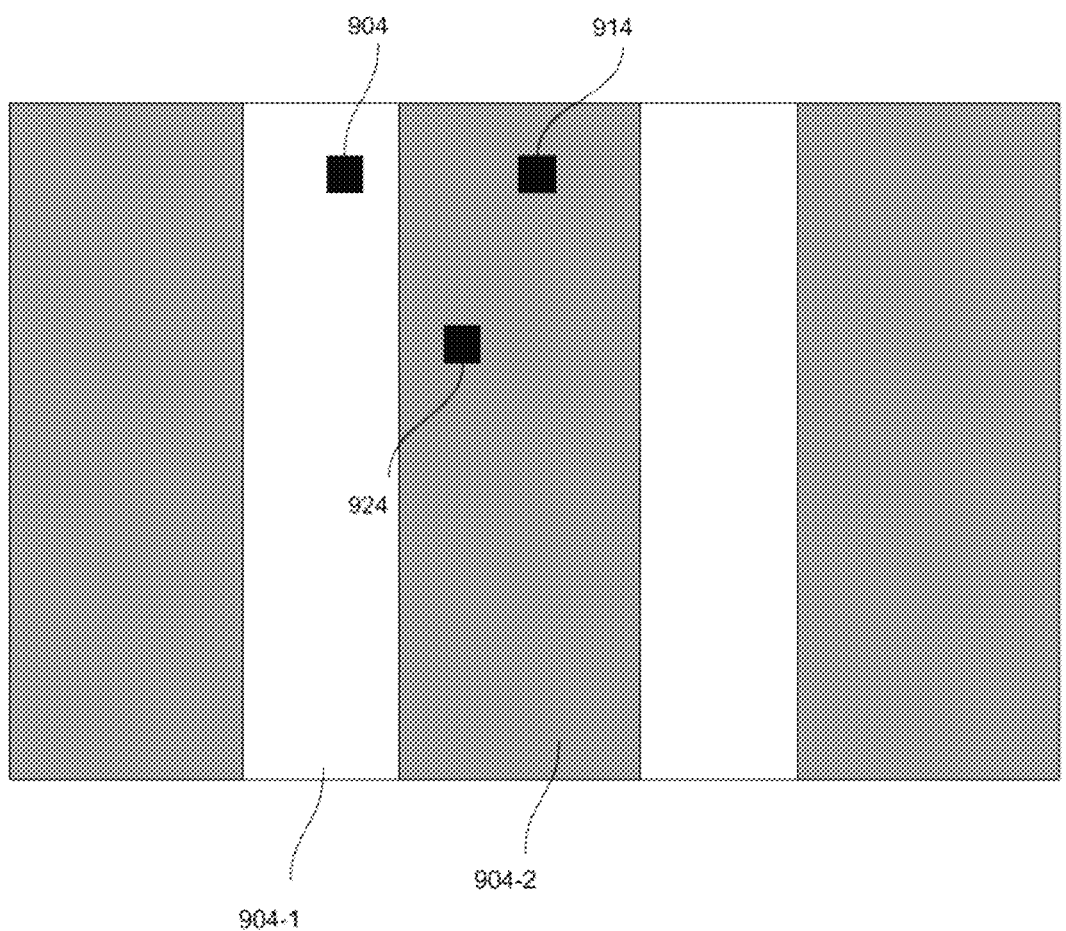
FIG. 9B shows another donor substrate embodiment with non-interfering area associated with the one of the pads in the pixel.
Figure 9C:
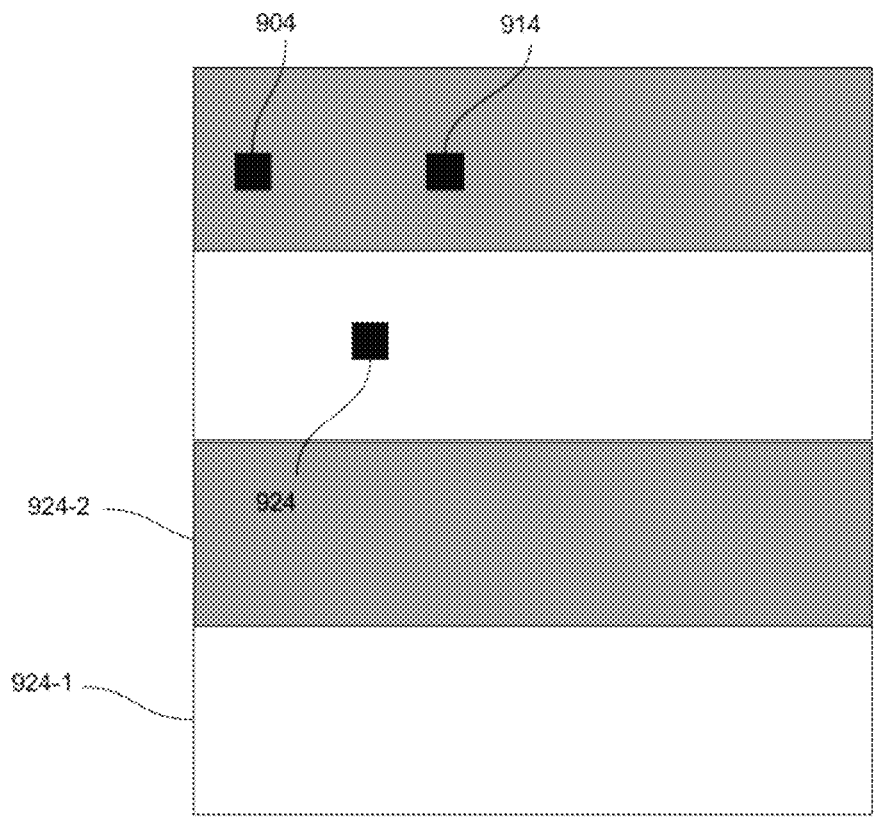
FIG. 9C shows another donor substrate embodiment with non-interfering area associated with the one of the pads in the pixel.
Figure 9D:
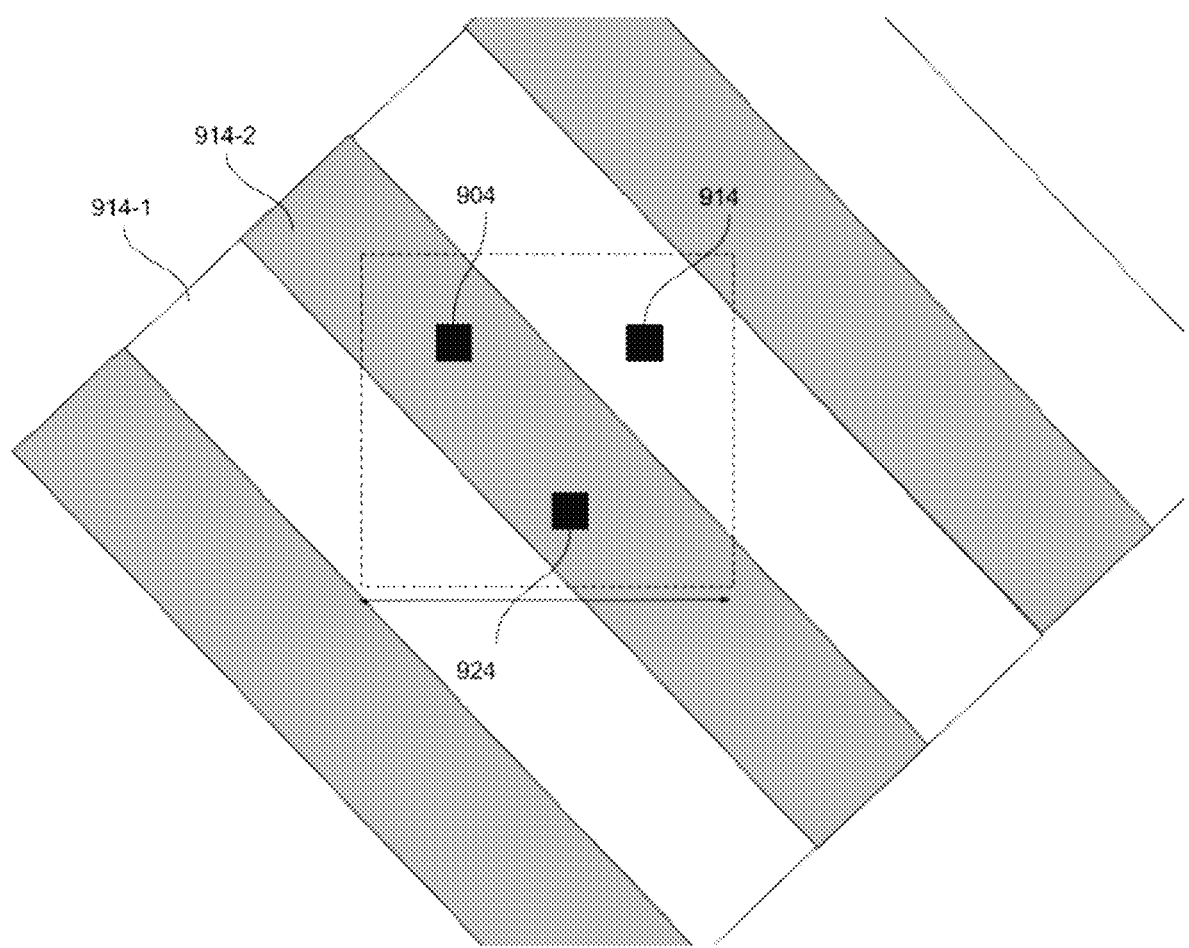
FIG. 9D shows another donor substrate embodiment with non-interfering area associated with the one of the pads in the pixel.

FIG. 8 shows another pixel orientation example 850. Here, the subpixels 802, 812, 822 are distributed in two dimensions. The pads 804, 814, 824 are shown in each corresponding subpixel 802, 812, 822 area. The distance 816, 826, 836, 806 between the pads define the interfering and non-interfering areas. The subpixels 802, 812, 822 can be aligned in vertical and horizontal orientations (or diagonally). For example, 814 and 824 can be aligned and so 826 can be zero.

FIG. 9 shows some examples for the interfering area and non-interfering areas for different pads. In FIG. 9A, the location of pad 904 is based on horizontal and vertical offsetting of micro devices. In this case, the non-interfering area 904-1 and interfering area 904-2 can be a combination of boxes around or off from the pads 904, 914, 924. FIG. 9B shows another example of the non-interfering area 904-1 and interfering area 904-2 for pad 904. Here, the denominator of the two non-interfering areas between pad 904 and 914 and pads 904 and 924 is used as the non-interfering area for pad 904. FIG. 9C shows horizontal non-interfering area 924-1 and interfering area 924-2. For pad 914, the most optimized case is based on diagonal offsetting. FIG. 9D shows the diagonal strips for non-interfering area 914-1 and interfering area 914-2. Other patterns also can be used with different offsetting directions. Here, one can also use different pad heights as described in FIG. 4 to improve the device utilization for some of the pads.

Figure 10:
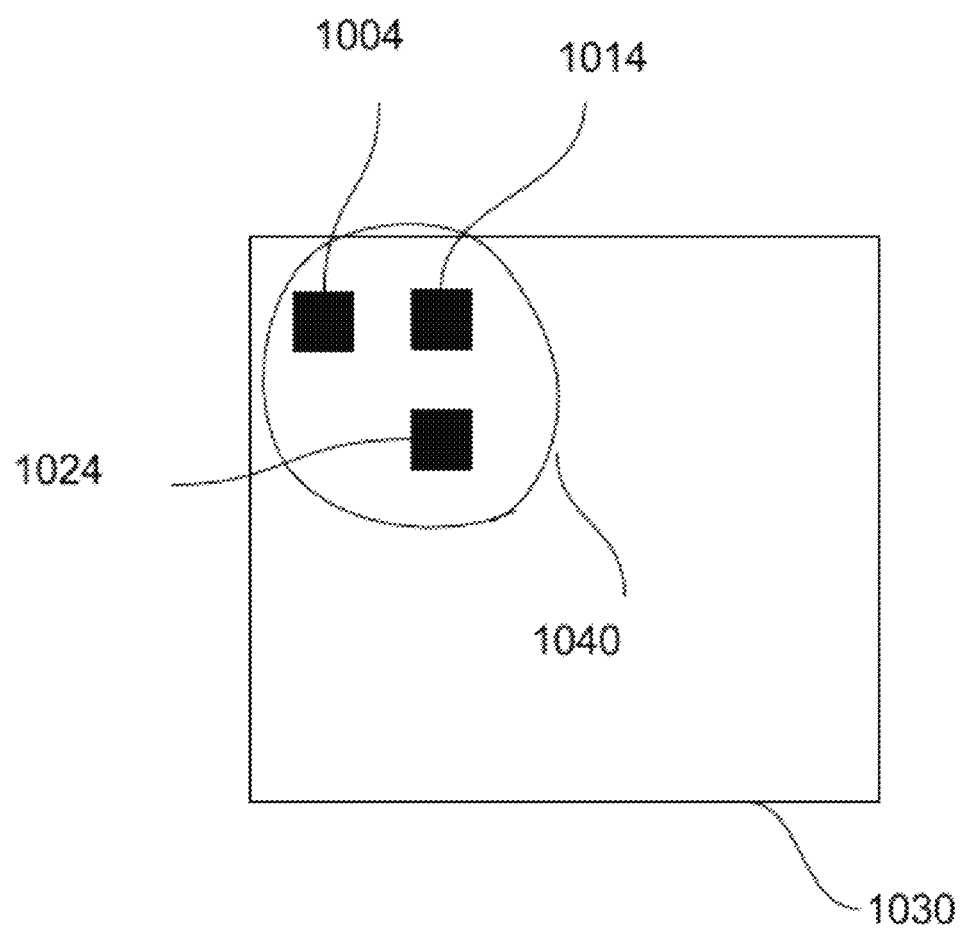
FIG. 10 shows an embodiment for cluster pads to improve the non-interfering area for the pixel pads arranged in two directions.

FIG. 10 shows another example of cluster pad 1040 where the pads 1004, 1014, 1024 are in two dimensions. Similar to FIG. 5, the pads 1004, 1014, 1024 can have a different pitch depending on different pitches of micro devices.

Figure 11A:
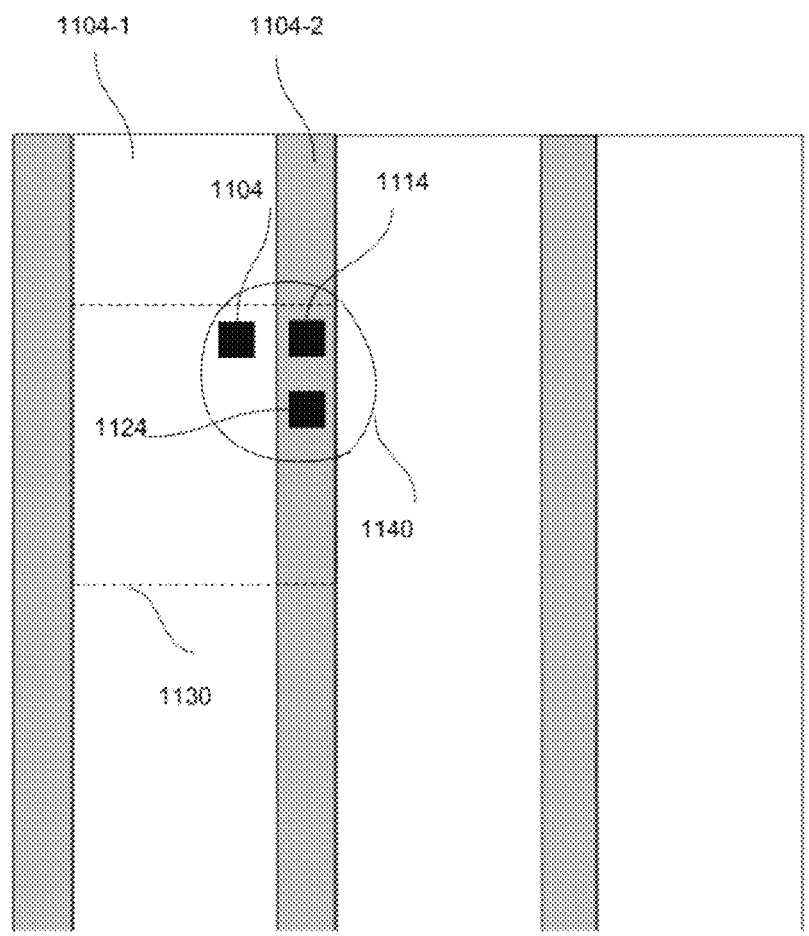
FIG. 11A shows a donor substrate embodiment with non-interfering area associated with the one of the pads in the cluster.
Figure 11B:
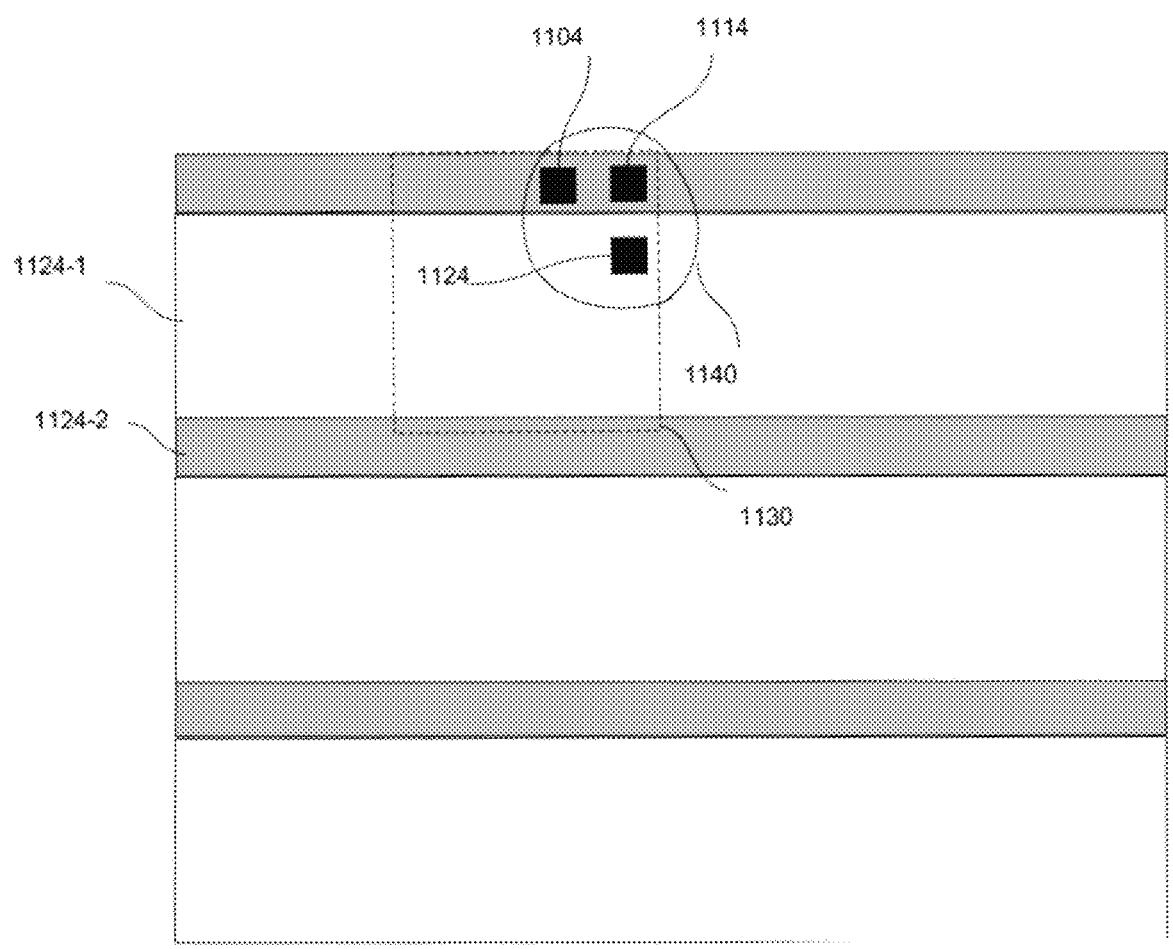
FIG. 11B shows another donor substrate embodiment with non-interfering area associated with the one of the pads in the cluster.
Figure 11C:
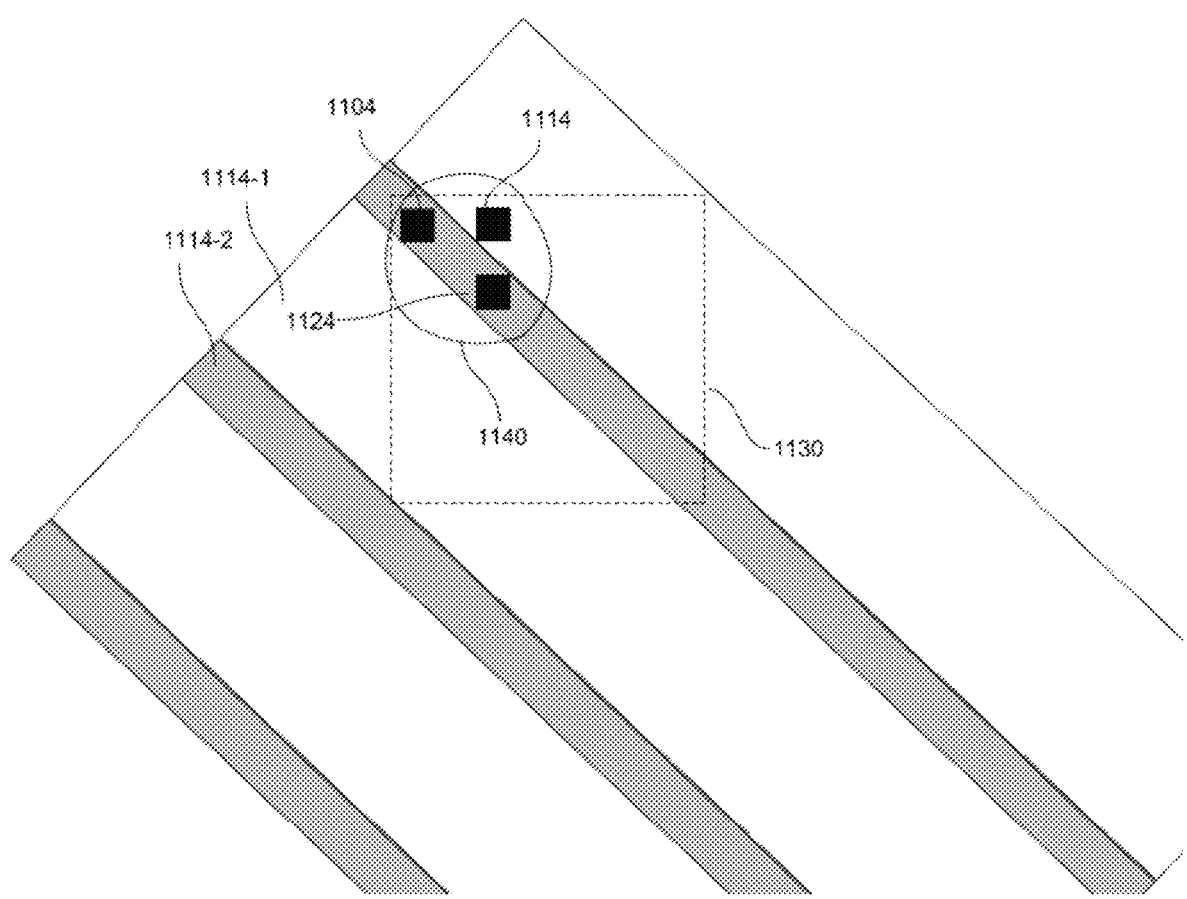
FIG. 11C shows another donor substrate embodiment with non-interfering area associated with the one of the pads in the cluster.
Figure 12A:
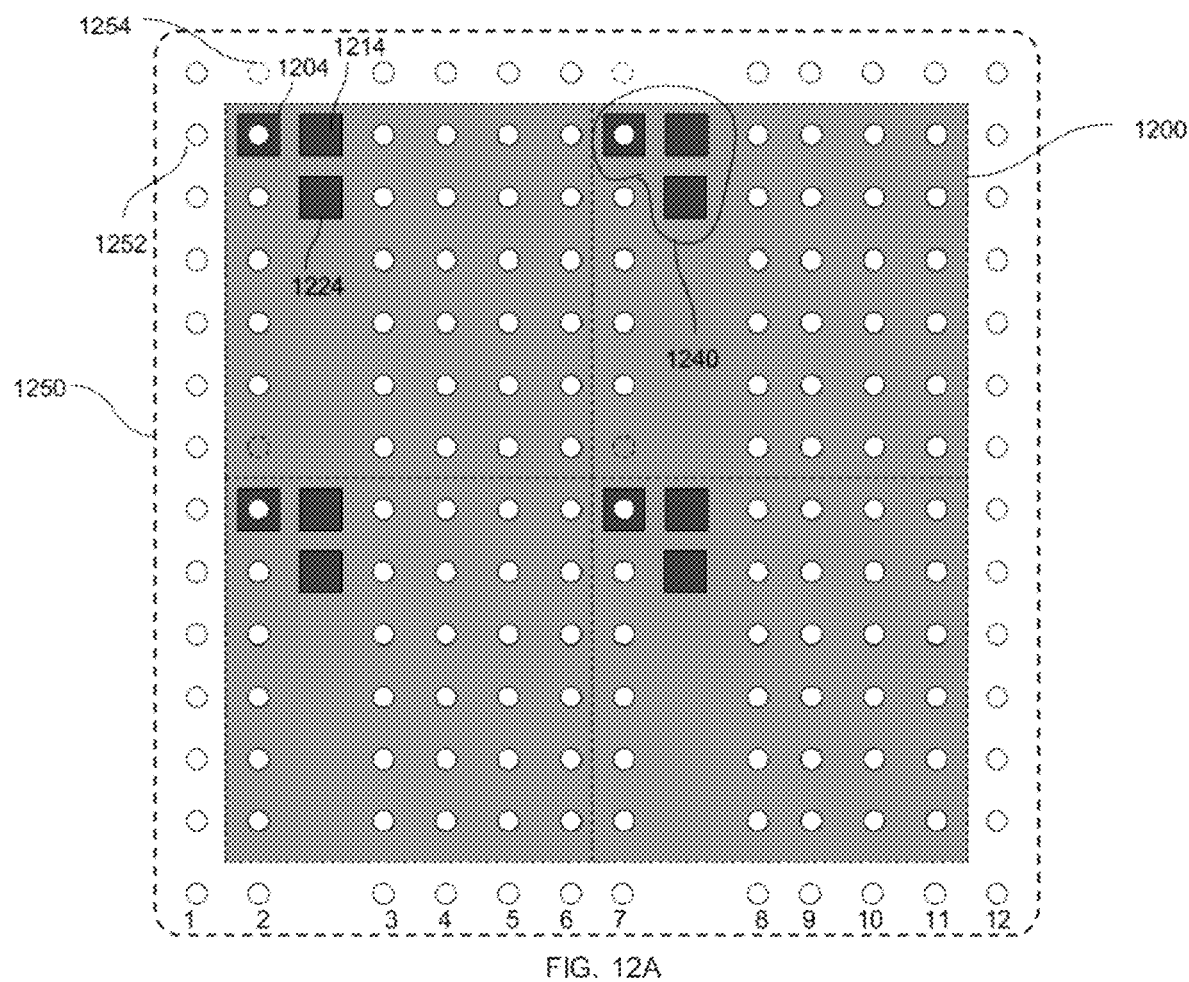
FIG. 12A shows an example of a donor substrate and receiver substrate with cluster pads arranged in two directions.
Figure 12B:
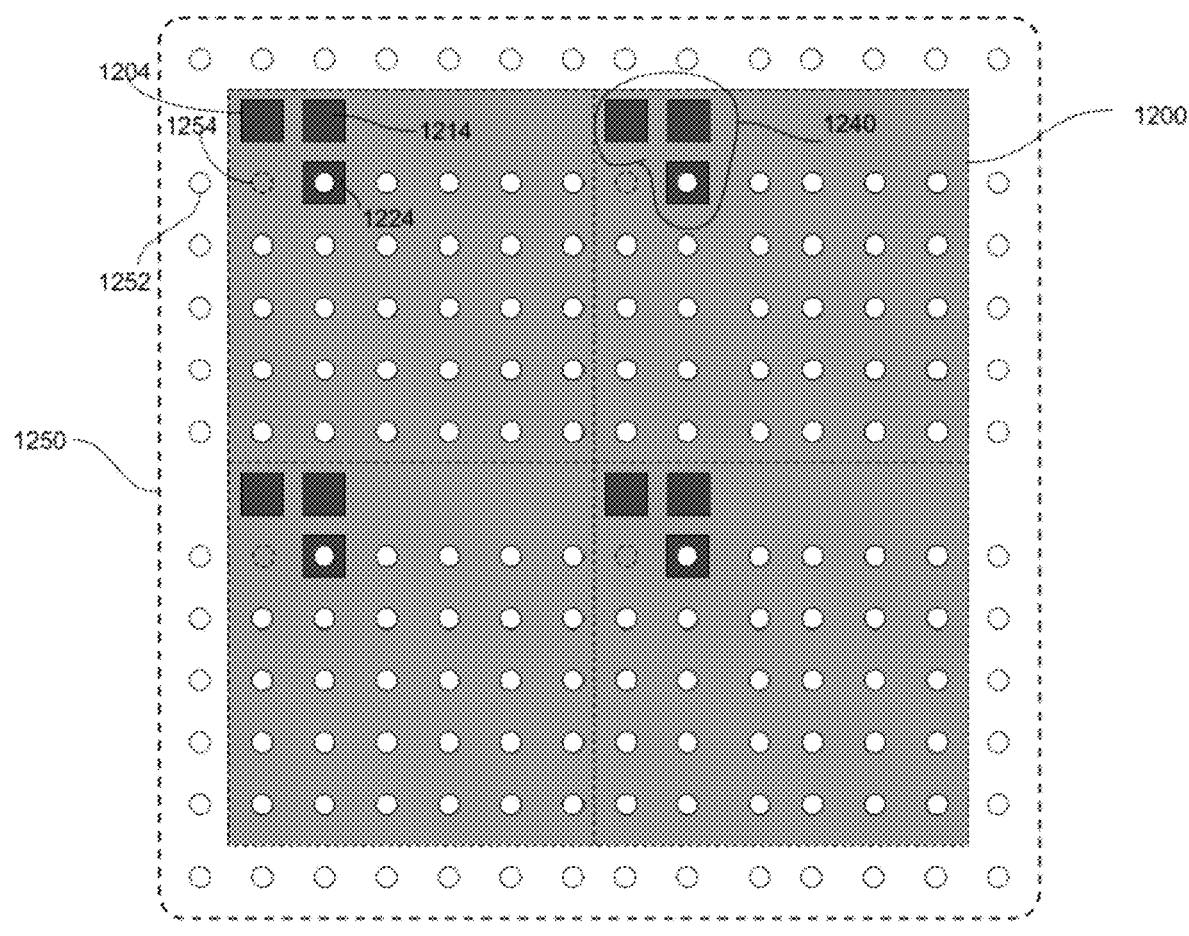
FIG. 12B shows an example of a donor substrate and receiver substrate with cluster pads arranged in two directions.
Figure 12C:
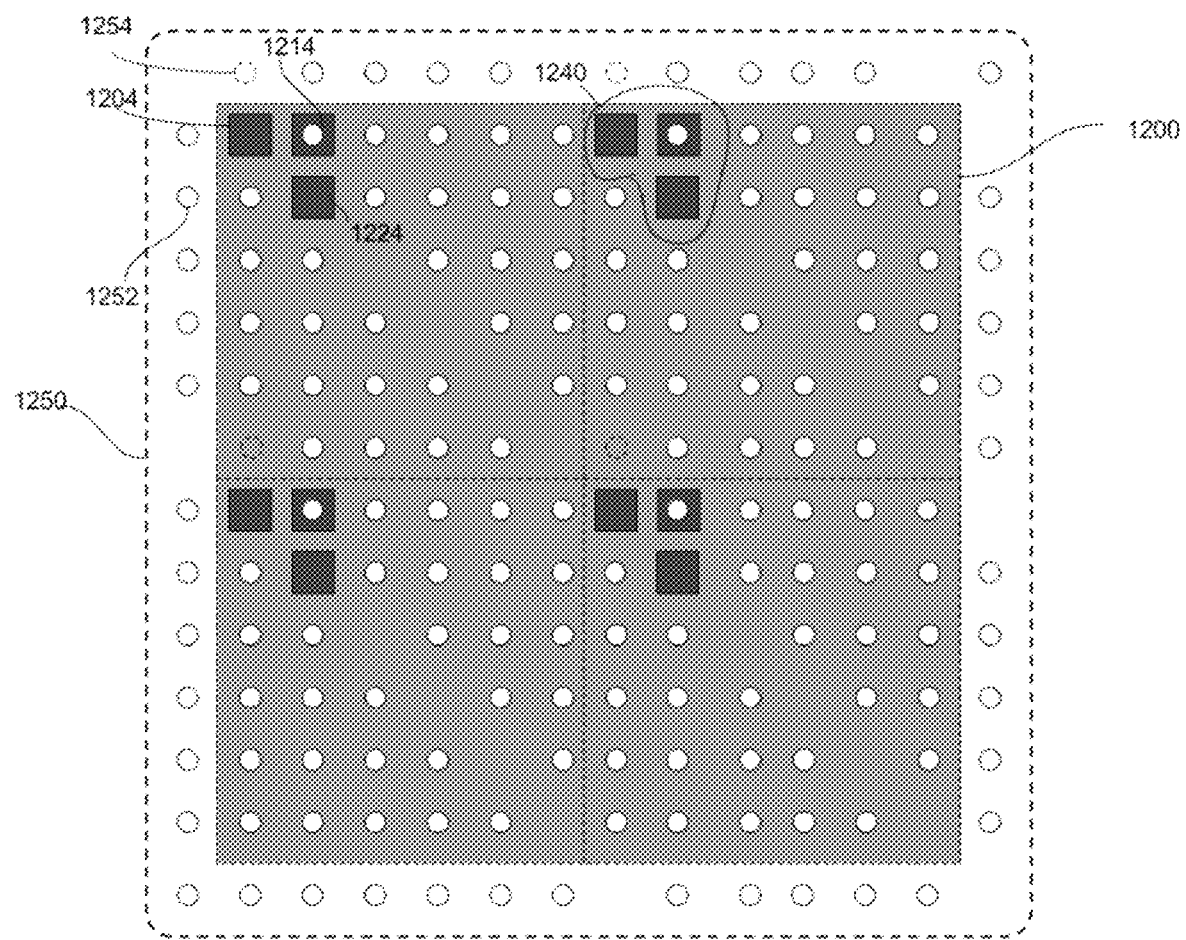
FIG. 12C shows an example of a donor substrate and receiver substrate with cluster pads arranged in two directions.
Figure 12D:
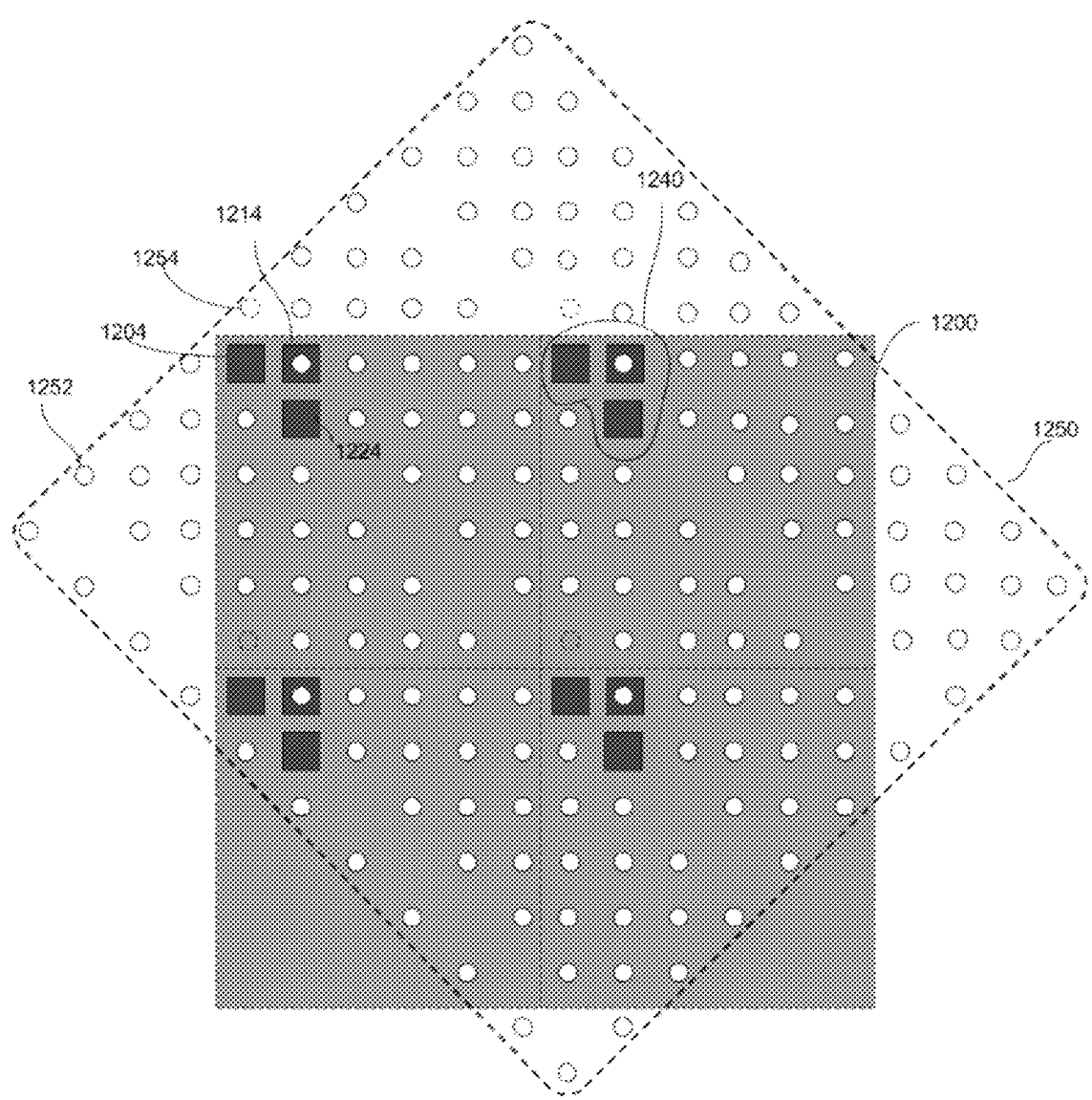
FIG. 12D shows an example of a donor substrate and receiver substrate with cluster pads arranged in two directions.

FIG. 11A shows the non-interfering area 1104-1, and interfering area 1104-2 for the pad 1104 at the edge of the cluster 1140. As it can be seen, the non-interfering areas for the pads at the edge are larger compared to previous cases. FIG. 11B shows the non-interfering area 1124-1 and interfering area 1124-2 for pad 1124. For the pad 1114 in the middle, the non-interfering area 1114-1 and interfering area 1114-2 can be a diagonal stripe pattern as demonstrated in FIG. 11C. Here, the width of the strip is the same as the distance between the middle pad and the other pads. If the distance between the middle pad and the other pads is the same, the ratio of interfering area 1114-2 to non-interfering area 1114-1 can be the same. Similar to FIG. 3B, here the two areas can have different shape depending on the offsetting direction. Also, similar to FIG. 4, the middle pad can be taller and so in this case the non-interfering area for the middle micro device can be the entire donor substrate.

FIG. 12 shows a case where the pads 1204, 1214, 1224 in receiver substrate 1200 have the same pitch as micro devices in donor substrate 1250. The position of the pads cluster 1240 can be different in reference to the pixels 1230. The size of the pads can be smaller or similar or larger than the micro devices. The shape of the micro devices and pads can be anything. In this case, the micro devices are removed (or not populated) from the interfering area on the donor substrate 1250. FIG. 12A shows a case for the edge pad 1204. Some of the micro devices 1254 are already transferred and the donor substrate 1250 (or receiver substrate 1200) is offsetted vertically in reference to the receiver substrate 1200 (or donor substrate 1250) so that another device is aligned with the bare pads 1204 (pads with no micro device transferred). This can also be done horizontally. In this case, the empty spaces created by transferring micro device 1254 will be a new empty area which will be on top of other pads 1214, 1224. As such there will be no interference caused by the micro devices for the unwanted pads 1214, 1224. One can finish all the micro devices in one column by offsetting vertically first and then moving to the next column (for example after finishing column 2, move to column 1). However other combinations of vertical and horizontal offsetting can be used. The pixels 1230 or the pad clusters 1240 can be at an angle either vertically or horizontally. In this case, the rows or the columns of micro devices will be tilted as well. In addition, the micro devices can be at an angle without pads or pixels being at angles. In this case, the offsetting direction will be toward the angle of the column or the row. FIG. 12B shows a similar structure of pad 1204 in FIG. 12A for the middle pad 1224. However, the interfering area with no micro device is horizontal. FIG. 12C shows the donor substrate 1250 for the middle pad 1214. Here, the interfering area is diagonal and the offsetting is diagonal, vertical, and horizontal. FIG. 12D is a similar structure of pad 1214 but with a slightly different arrangement for micro devices to maximize the transfer.

Figure 13A:
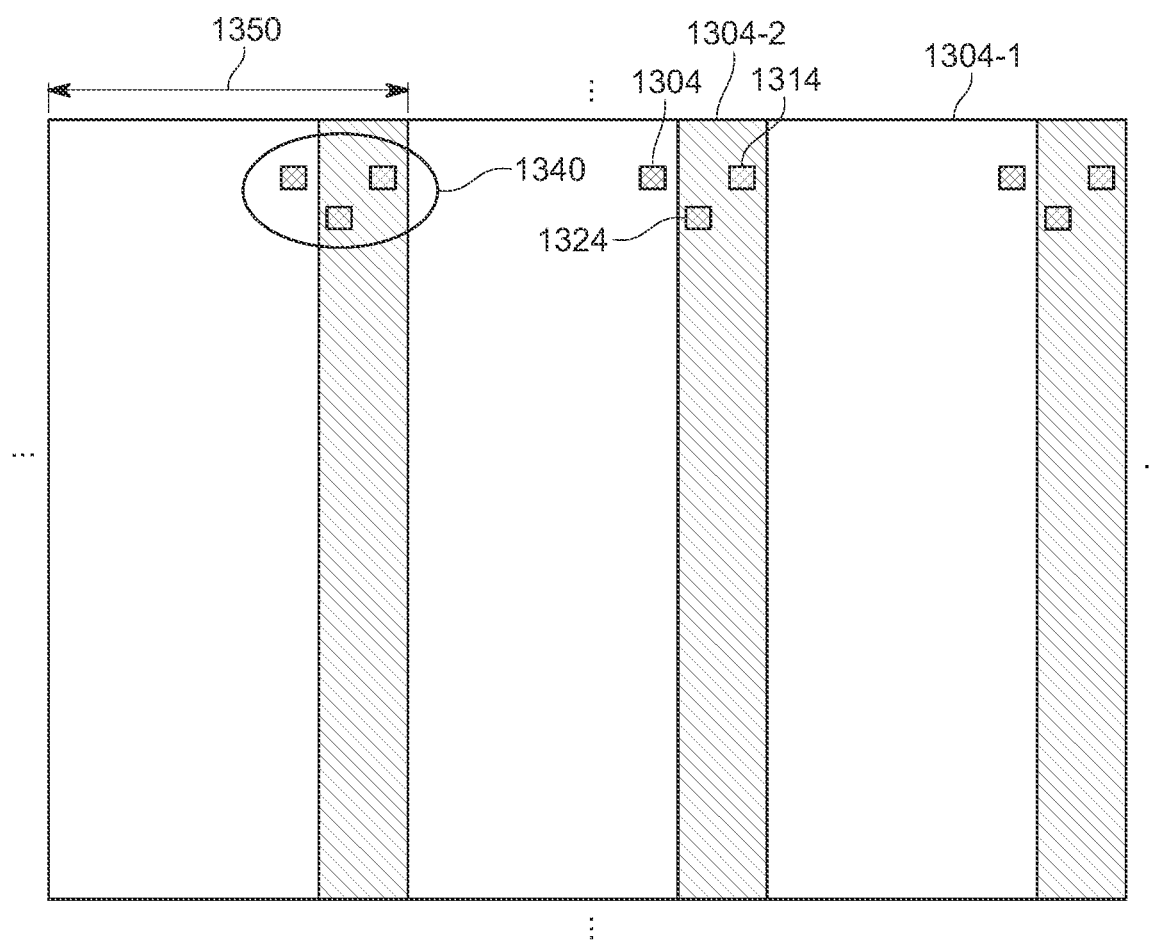
FIG. 13A shows the pad cluster in a receiver substrate and a donor substrate embodiment with non-interfering area associated with reference to one of the pads in the cluster.
Figure 13B:
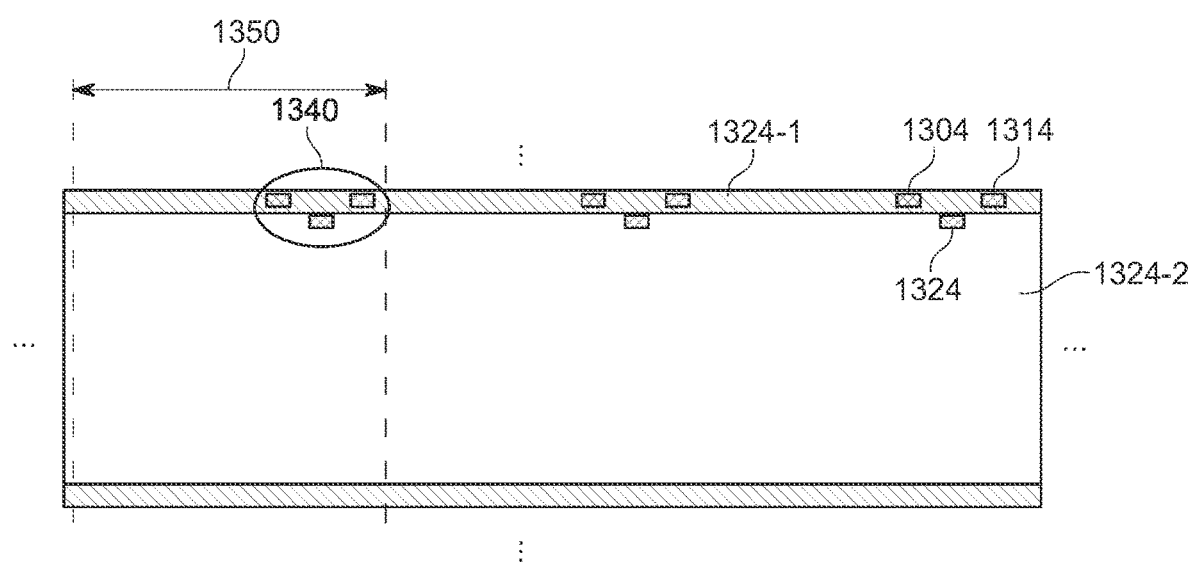
FIG. 13B shows another donor substrate embodiment with non-interfering area associated with the one of the pads in the cluster.

FIG. 13A shows the non-interfering area 1304-1, and interfering area 1304-2 for the pad 1304 at the edge of the cluster 1340 for a pixel width 1350 corresponding to a void area on a donor substrate. As it can be seen, the non-interfering areas for the pads at the edge are larger compared to previous cases. The same pattern can be used for pad 1314. For the pad 1324 in the middle, the non-interfering area 1314-1 and interfering area 1314-2 can be a vertical stripe pattern as demonstrated in FIG. 13B. Here, the width of the non-interfering area 1314-1 is the same as the distance between the middle pad 1314 and the other pads 1304, 1324 in the other pixel. If the distance between the middle pad and the other pads is the same, the ratio of interfering area 1324-2 to non-interfering area 1324-1 can be the same. Similar to FIG. 3B, the two areas can have a different shape depending on the offsetting direction. Also, similar to FIG. 4, one of the pads can be taller and so in this case the non-interfering area for the middle micro device can be the entire donor substrate.

Figure 14A:
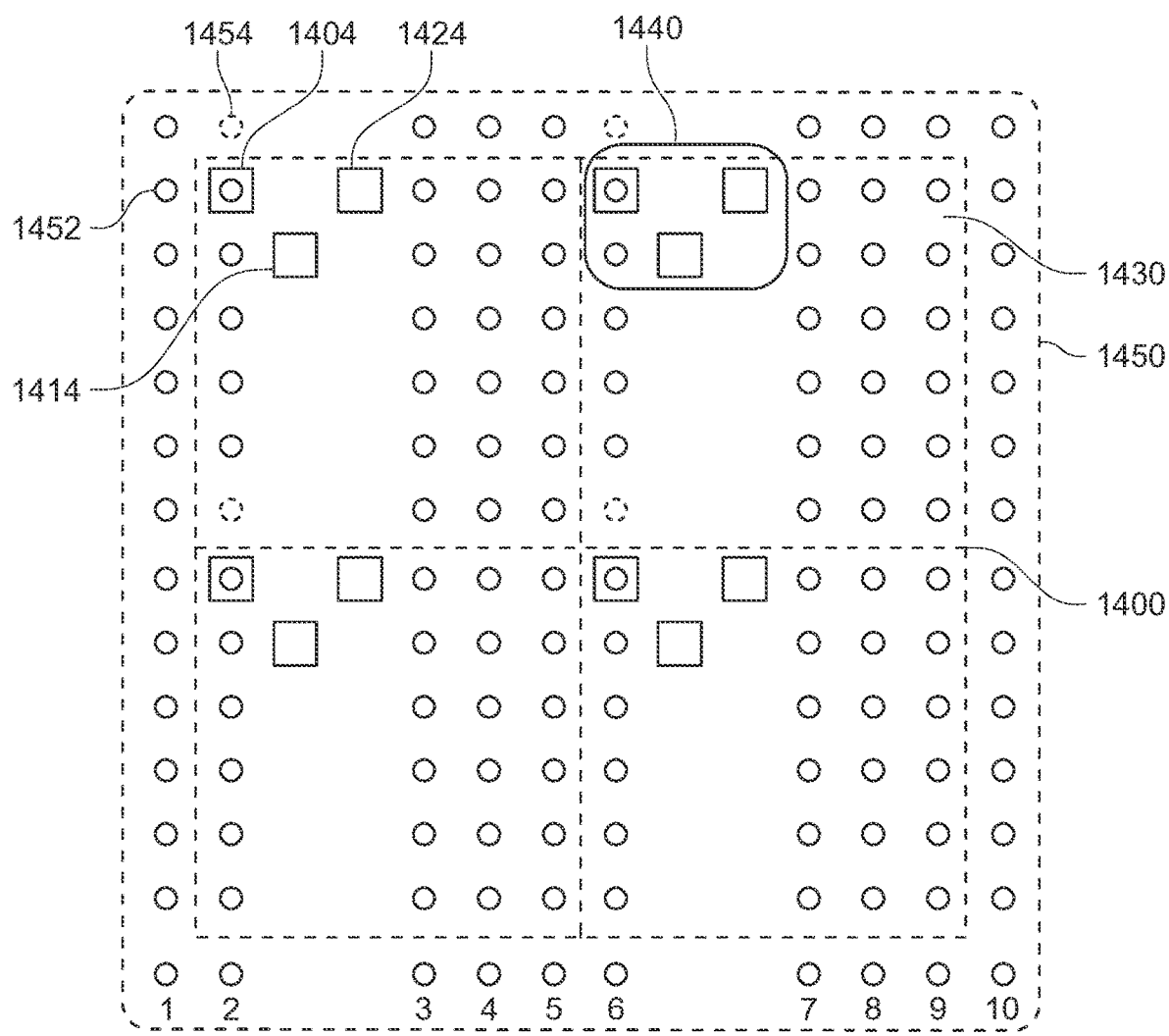
FIG. 14A shows an example of a donor substrate and receiver substrate with cluster pads arranged in two directions.
Figure 14B:
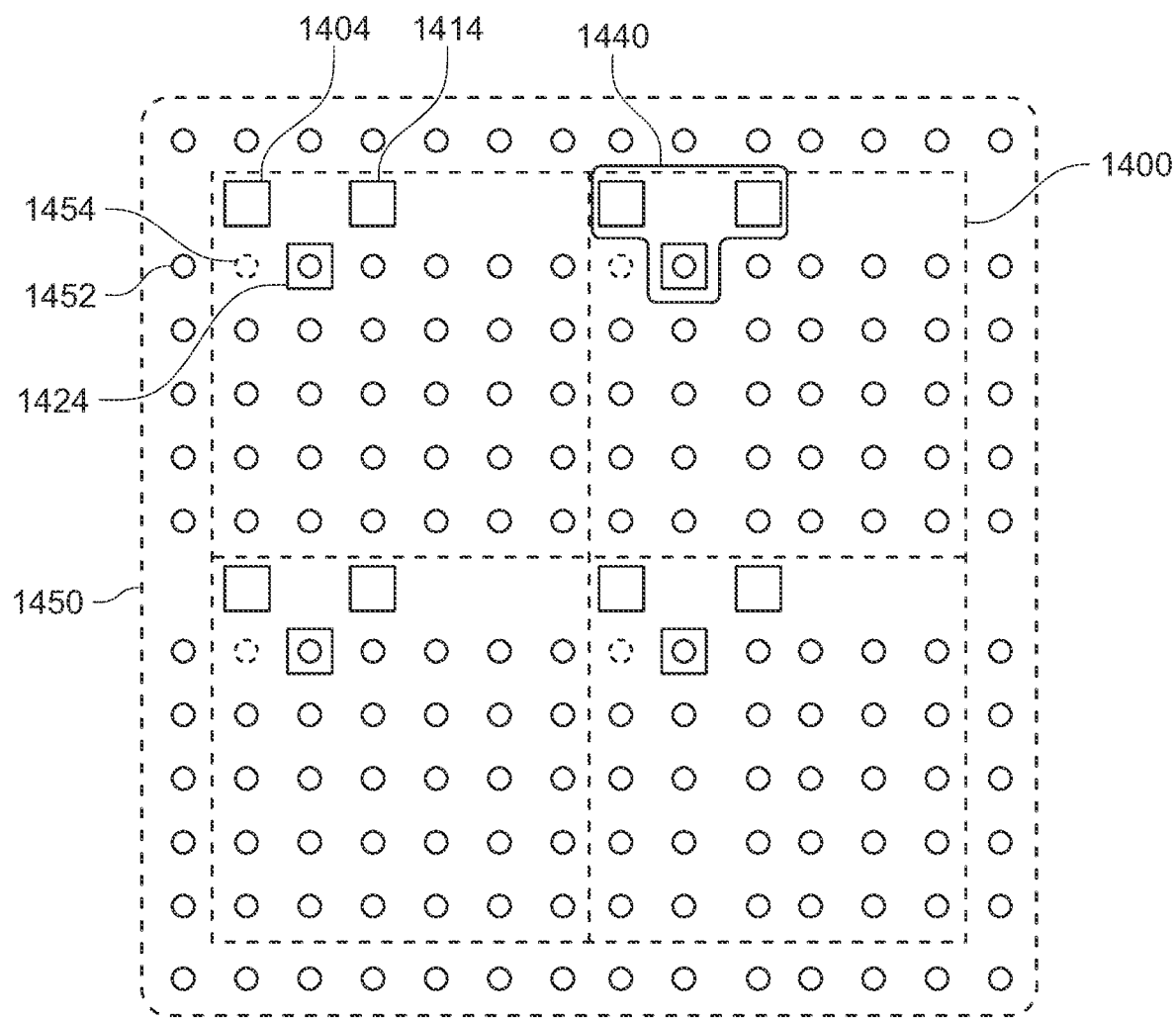
FIG. 14B shows an example of a donor substrate and receiver substrate with cluster pads arranged in two directions.

FIG. 14 shows a case where the pads 1404, 1414, 1424 in receiver substrate 1400 have the same pitch as micro devices in donor substrate 1450. The position of pads cluster 1440 can be different in reference to the pixels 1430. The size of the pads can be smaller or similar or larger than the micro devices. The shape of the micro devices and pads can be anything. In this case, the micro devices are removed (or not populated) from the interfering area on the donor substrate 1450. FIG. 14A shows a case for the edge pad 1404. Some of micro devices 1454 are already transferred and the donor substrate 1450 (or receiver substrate 1400) is offset vertically in reference to receiver substrate 1400 (or donor substrate 1450) so that another device is aligned with the bare pads 1404 (pads with no micro device transferred). This can] also be done horizontally. In this case, the empty spaces created by transferring micro device 1454 will be a new empty area which will be on top of other pads 1414, 1424. As such there will be no interference caused by the micro devices for the unwanted pads 1414, 1424. One can finish all the micro devices in one column by offsetting vertically first and then moving to the next column (for example after finishing column 2, move to column 1). However other combinations of vertical and horizontal offsetting can be used. The pixels 1430 or the pad clusters 1440 can be at an angle either vertically or horizontally. In this case, the rows or the columns of micro devices will be tilted as well. In addition, the micro devices can be at an angle without the pads or pixels being at angles. In this case, the offsetting direction will be toward the angle of the column or the row. FIG. 14B shows a similar structure of pad 1404 in FIG. 14A for the middle pad 1414. However, the interfering area with no micro device is horizontal.

The invention claimed is:

1. A method of arranging micro devices in the donor substrate, used to transfer micro devices to the receiver substrate, where micro devices are arranged in relation to the pixel area and the micro devices inside the area associated with the pixel has a pitch that is smaller than the pixel pitch.

2. The arrangement method of claim 1, wherein the pitch between the micro devices at the boundary of two pixels are different from the pitch of micro devices within the pixel.

* * * * *